US006376924B1

(12) United States Patent
Tomita et al.

(10) Patent No.: US 6,376,924 B1
(45) Date of Patent: Apr. 23, 2002

(54) POSITION CHECK MARK

(75) Inventors: Kazuo Tomita; Atsushi Ueno, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/484,066

(22) Filed: Jan. 18, 2000

(30) Foreign Application Priority Data

Jul. 21, 1999 (JP) .......................................... 11-206305

(51) Int. Cl.[7] .......................................... H01L 23/544

(52) U.S. Cl. ....................... 257/797; 257/758; 438/401; 438/462; 438/975

(58) Field of Search ................................ 257/758, 797; 438/401, 462, 975

(56) References Cited

U.S. PATENT DOCUMENTS 5,128,283 A * 7/1992 Tanaka ....................... 437/228
5,266,511 A * 11/1993 Takao .......................... 437/51
5,422,315 A * 6/1995 Kobayashi .................. 437/228
5,629,540 A * 5/1997 Roh et al. ................... 257/306
5,889,335 A * 3/1999 Kuroi et al. ................ 257/797
6,023,083 A 2/2000 Tomita
6,023,101 A 2/2000 Tomita
6,025,645 A 2/2000 Tomita
6,114,767 A * 9/2000 Nagai et al. ................ 257/758
6,133,619 A * 10/2000 Sahota et al. ............... 257/649
6,153,936 A * 11/2000 Chao .......................... 257/774
6,232,628 B1 * 5/2001 Shirosaki et al. ........... 257/306

FOREIGN PATENT DOCUMENTS

JP 362079619 A * 4/1987 .................... 21/30
JP 2-172215 7/1990
JP 9-82669 3/1997
JP 411087488 A * 3/1999 .................... 21/76

* cited by examiner

*Primary Examiner*—Steven Loke
*Assistant Examiner*—Douglas W. Owens
(74) *Attorney, Agent, or Firm*—Oblon, Spivak, McClelland, Maier & Neustadt, P.C.

(57) ABSTRACT

A mark structure (100) consists of a gate oxide film (102) formed on a semiconductor substrate (101), a gate wiring layer (103) formed on the gate oxide film (102), an insulating film (104) formed on the gate wiring layer (103) and a sidewall (105) formed in contact with side surfaces of the insulating film (104), the gate wiring layer (103) and the gate oxide film (102). An opaque bit line layer (113) is formed of a polycide consisting of a doped polysilicon layer (1131) and a tungsten silicide layer (1132), extending from on the interlayer insulating film (107) to on the mark structure (100). With this structure, a semiconductor device which allows measurement of alignment mark and overlay check mark with high precision in a lithography process, has no structure unnecessary for a mark and suppresses creation of extraneous matter in a process of manufacturing a semiconductor device to prevent deterioration in manufacturing process yield and a method of manufacturing the semiconductor device can be provided.

10 Claims, 17 Drawing Sheets

MK11 100 108 113 A A 1132 1131 113 104 105 107 106 102 1032 1031 103 101 100

F I G. 1
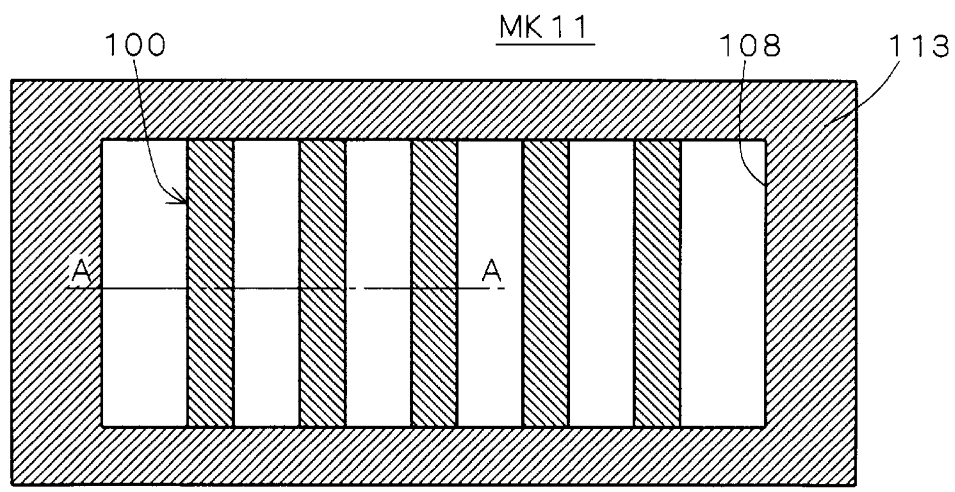
F I G. 2
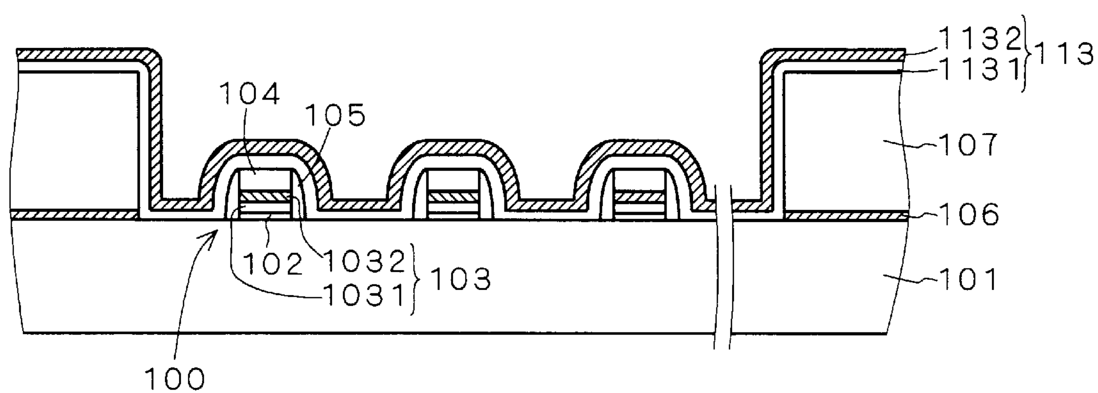
F I G. 3
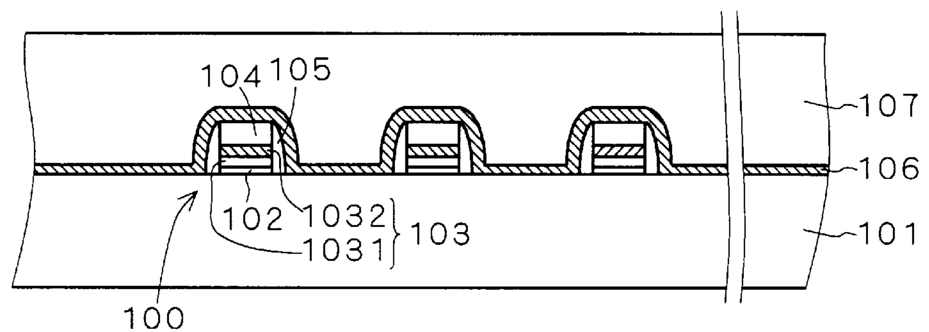

F I G. 4
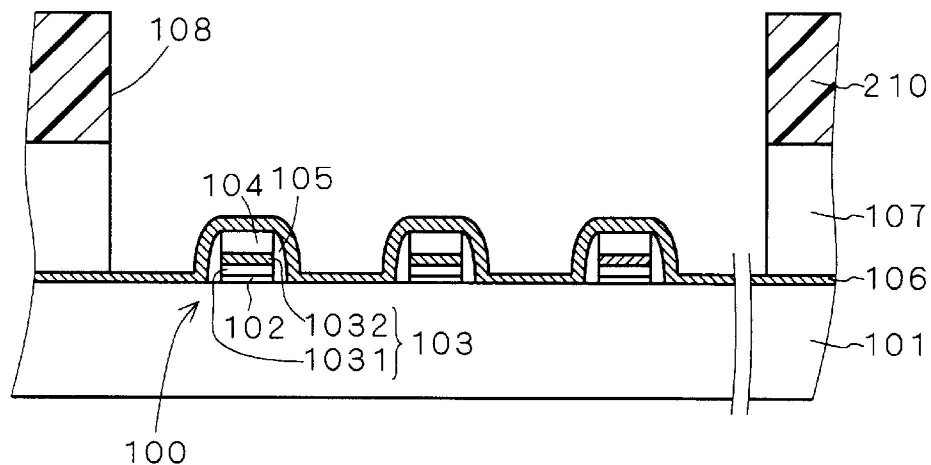
F I G. 5
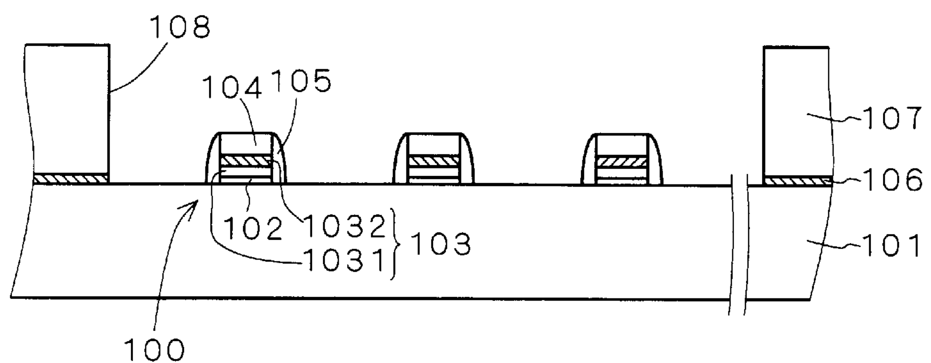
F I G. 6
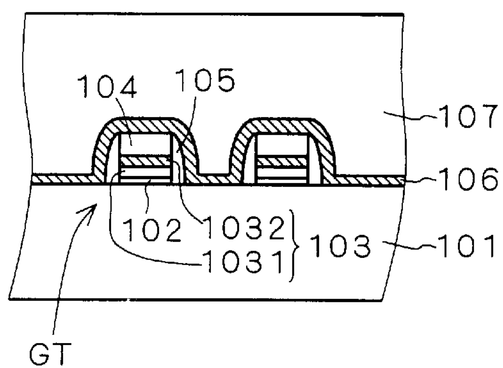

F I G. 7
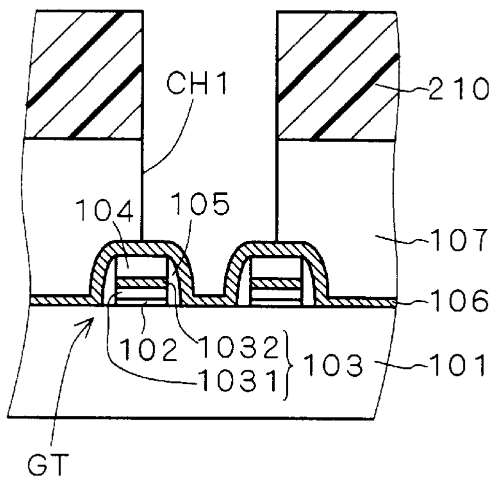
F I G. 8
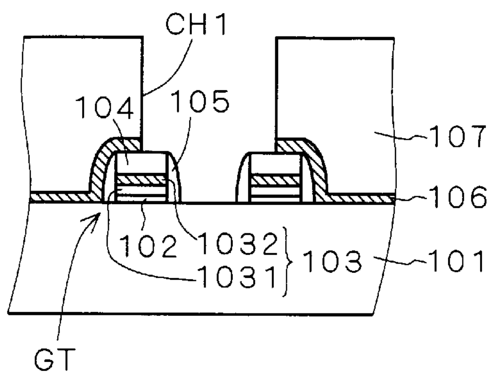
F I G. 9
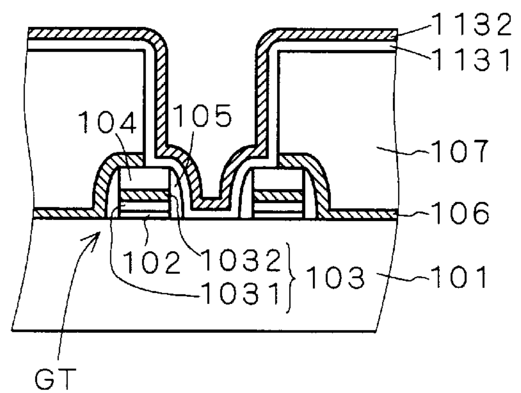

F/G. 10
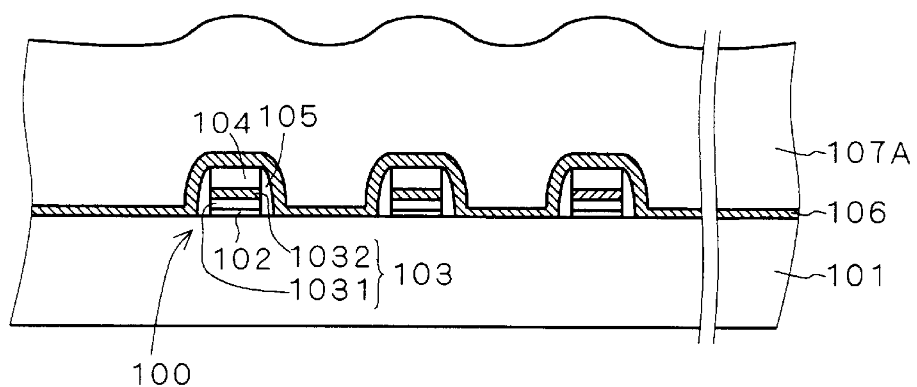
F/G. 11
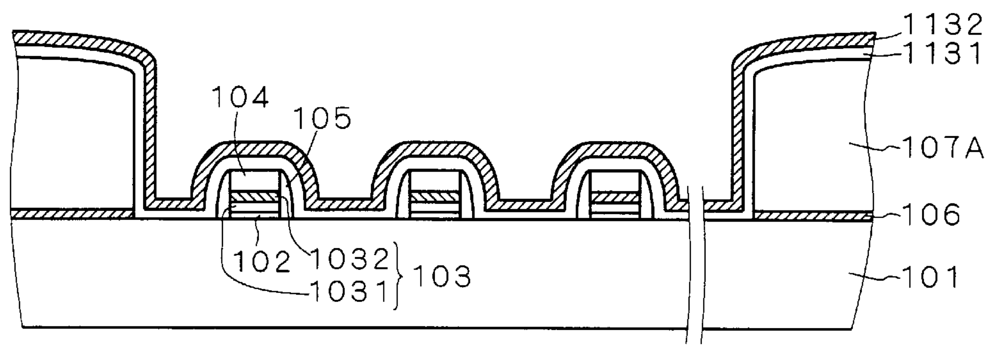
F/G. 12
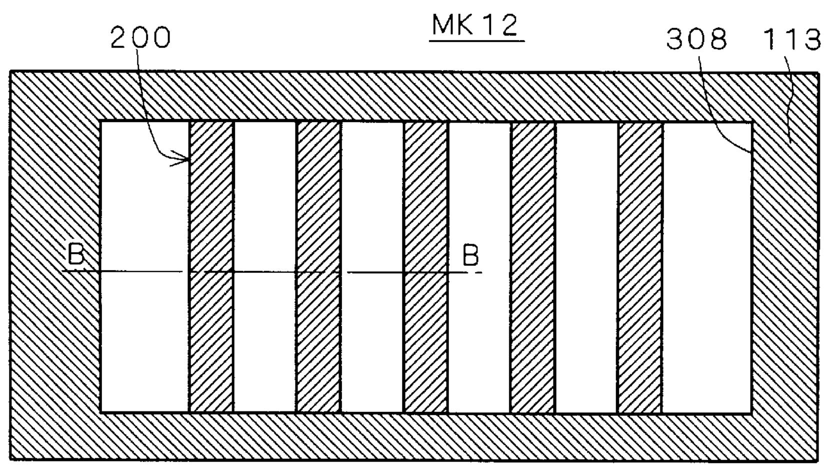

F/G. 13
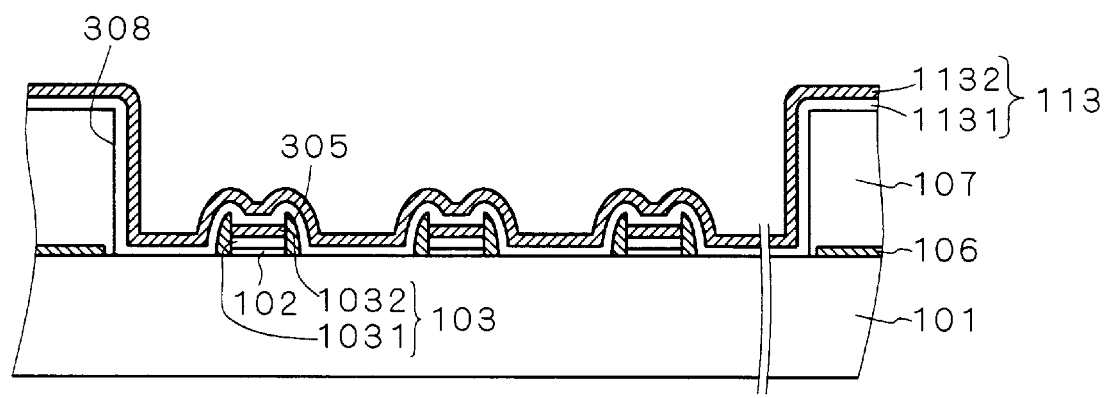
F/G. 14
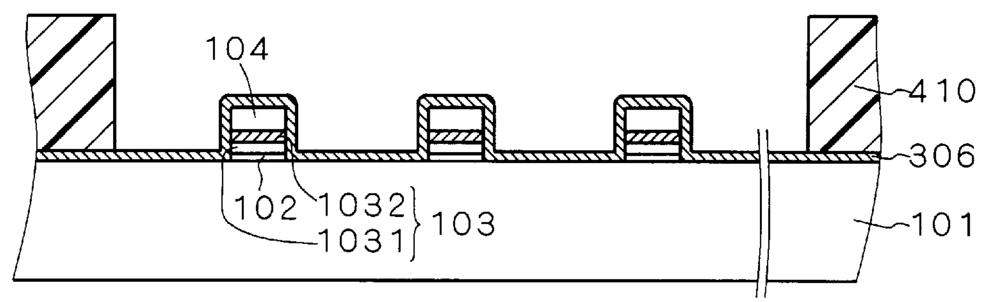
F/G. 15
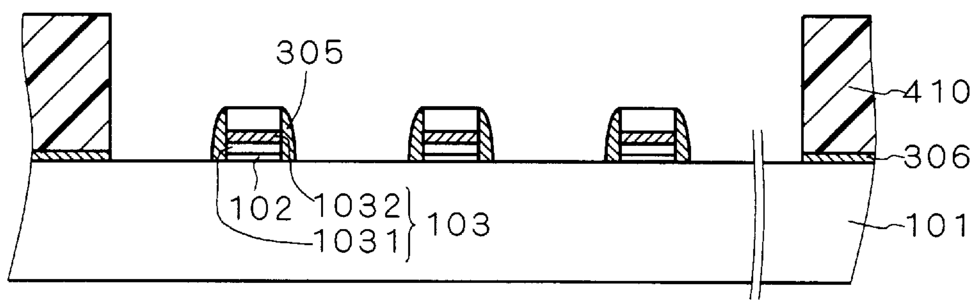

F/G. 16
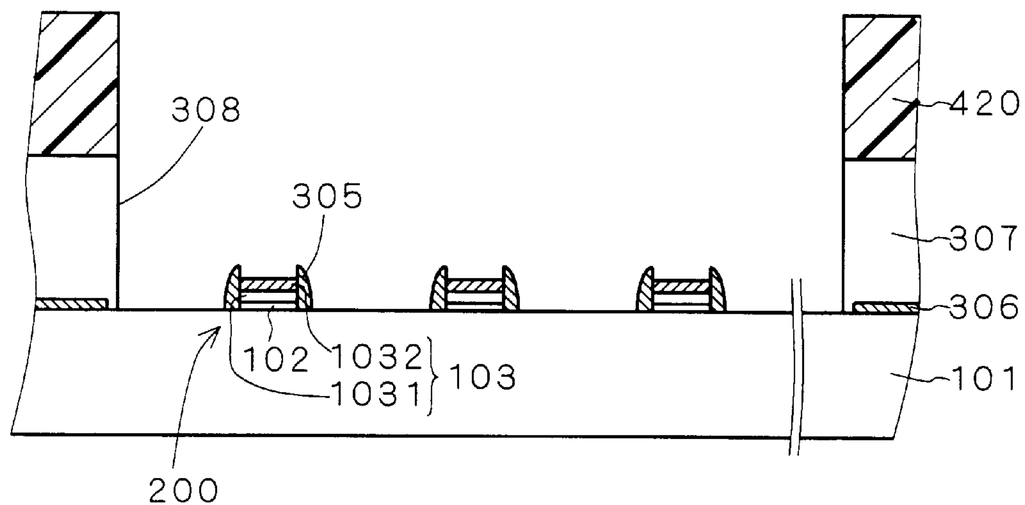
F/G. 17
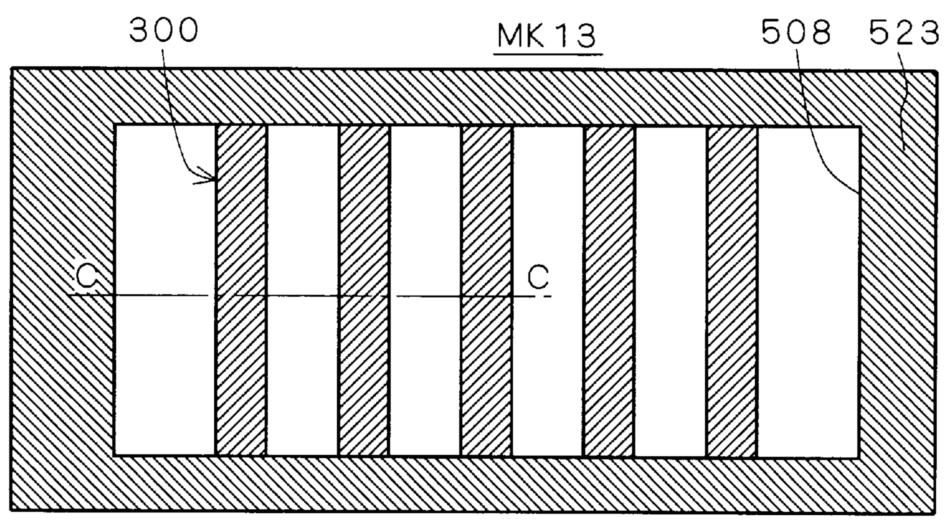

*F I G. 18*
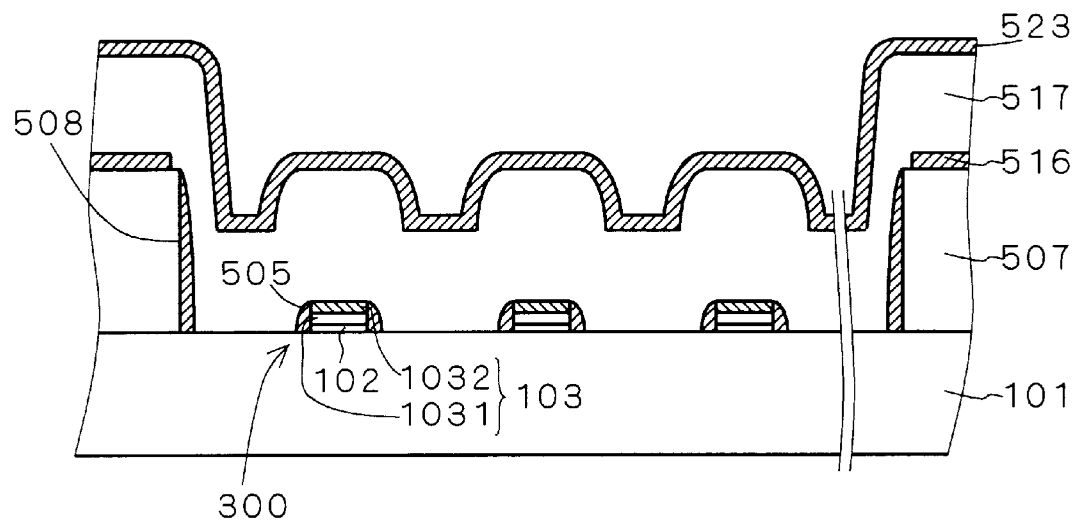
*F I G. 19*
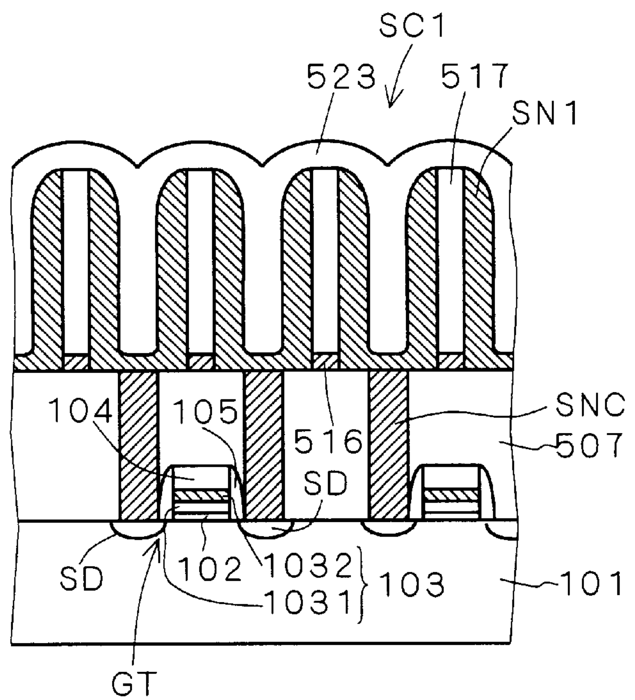

F/G. 20
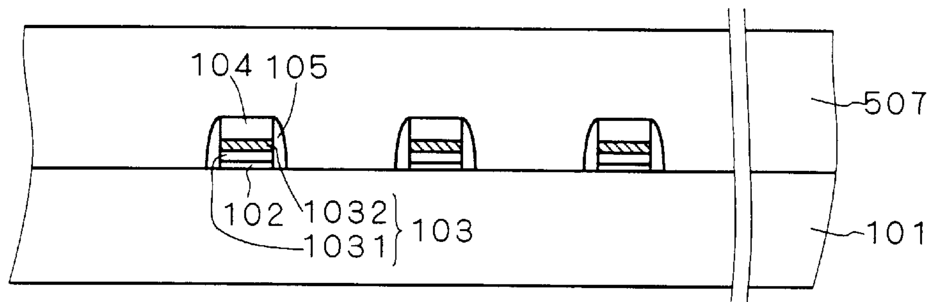
F/G. 21
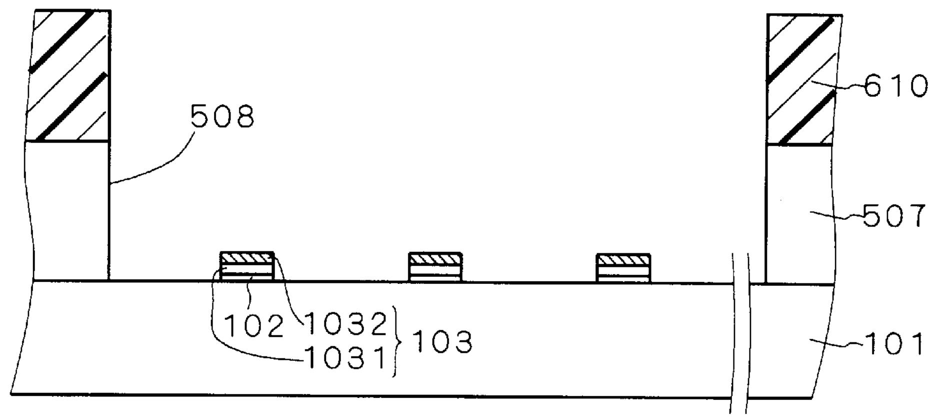
F/G. 22
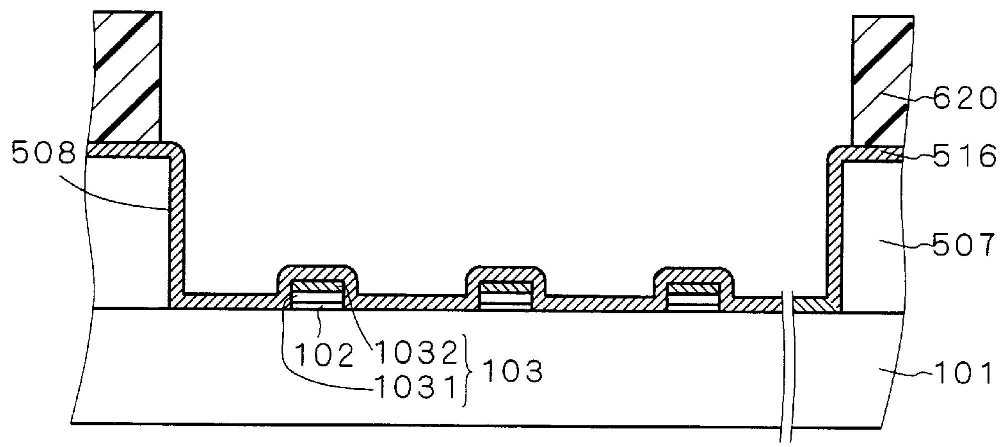

F I G. 23
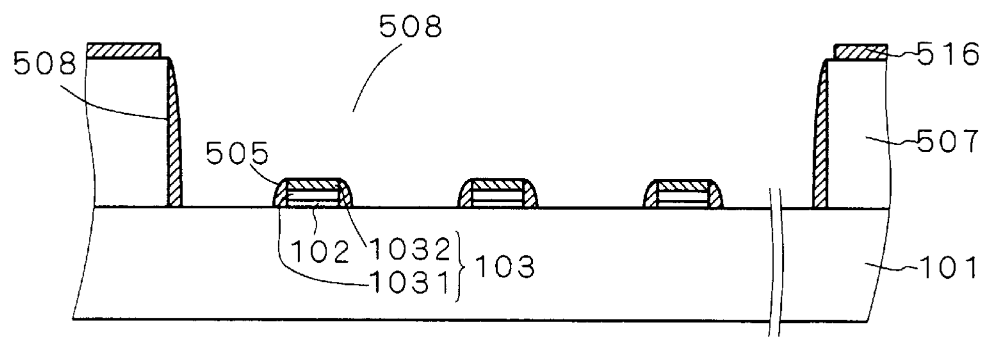
F I G. 24
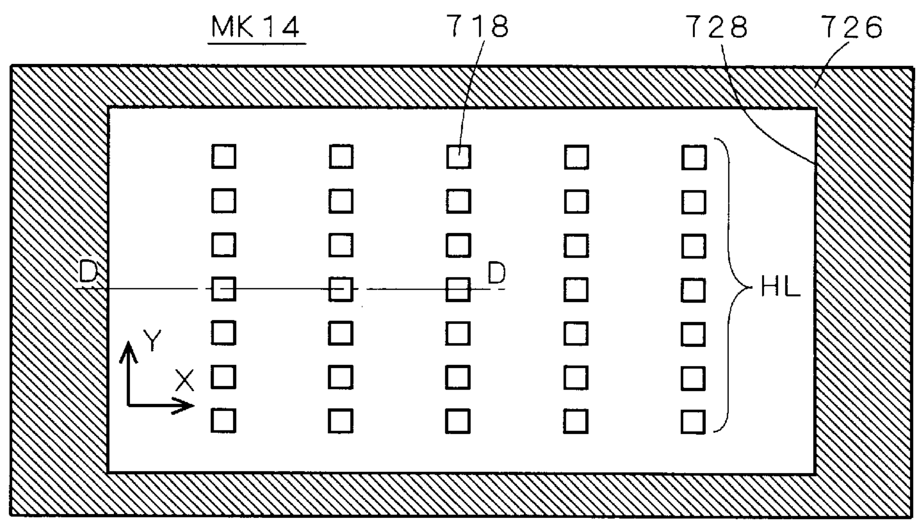
F I G. 25
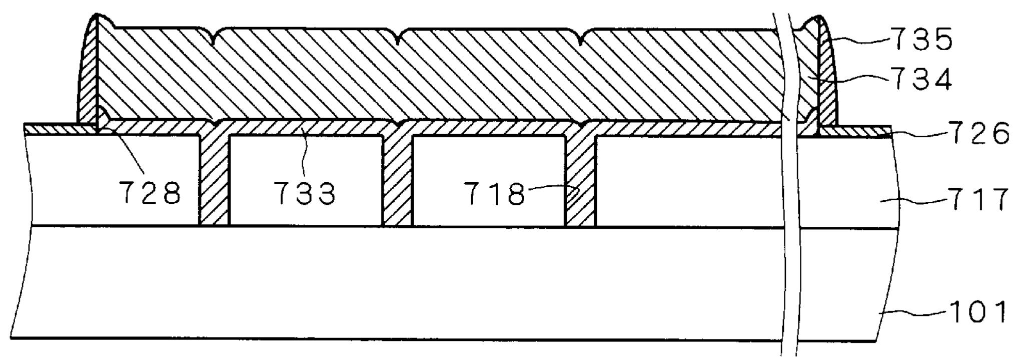

F/G. 26
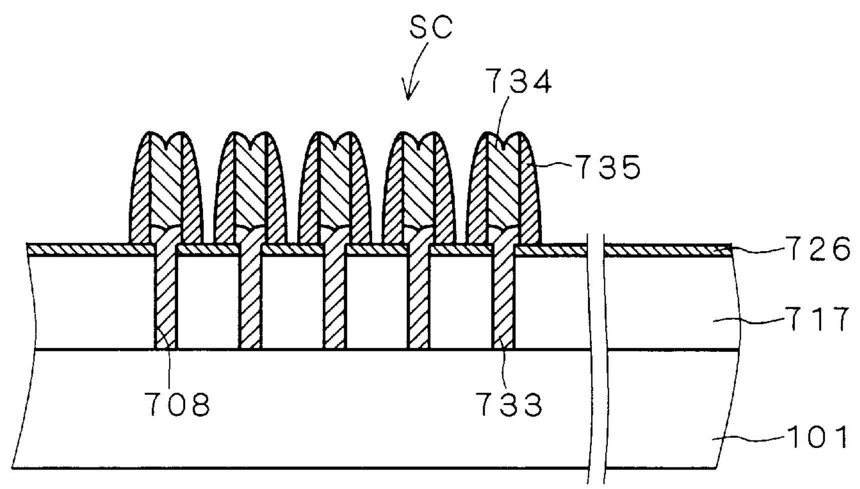
F/G. 27
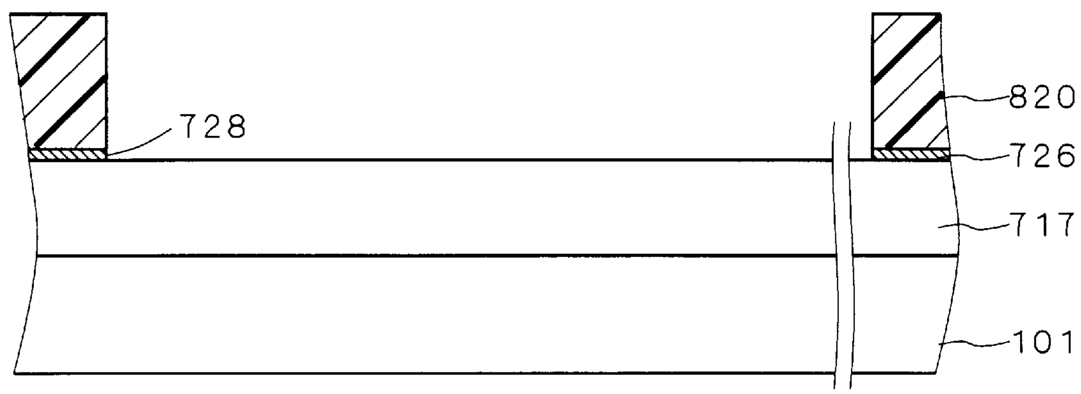
F/G. 28
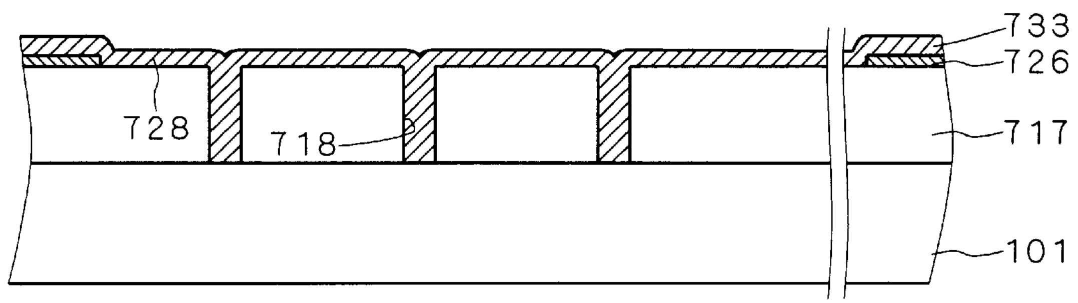

F I G. 29
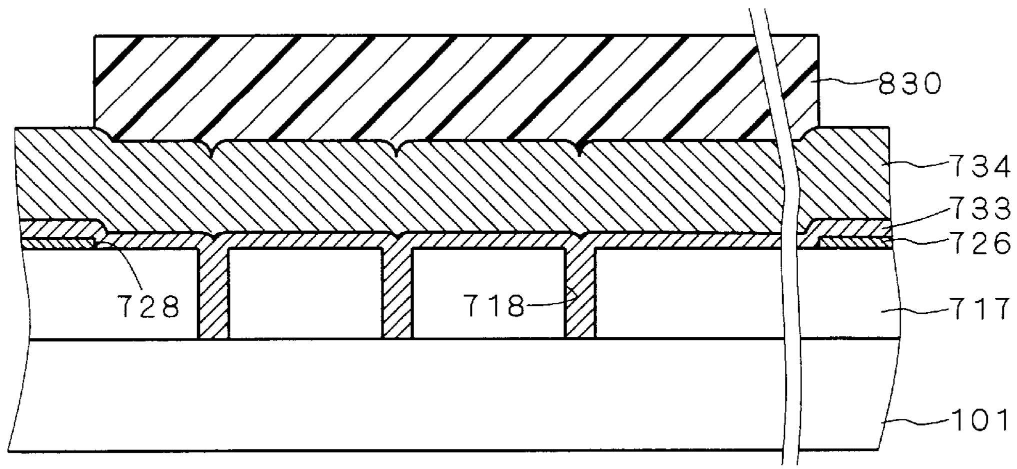
F I G. 30
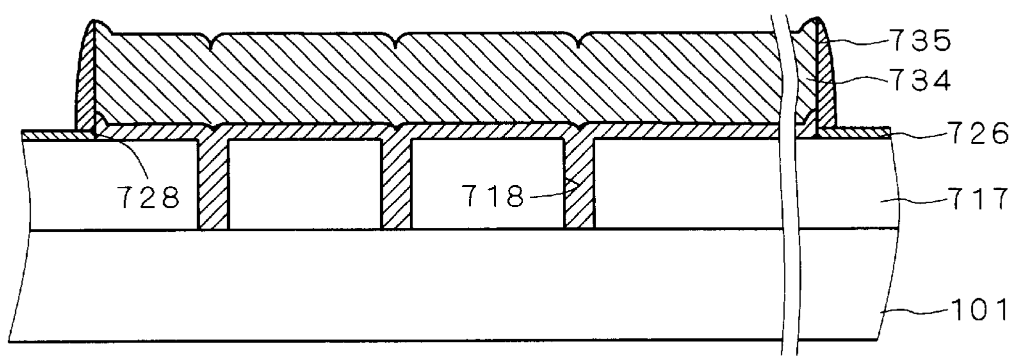
F I G. 31
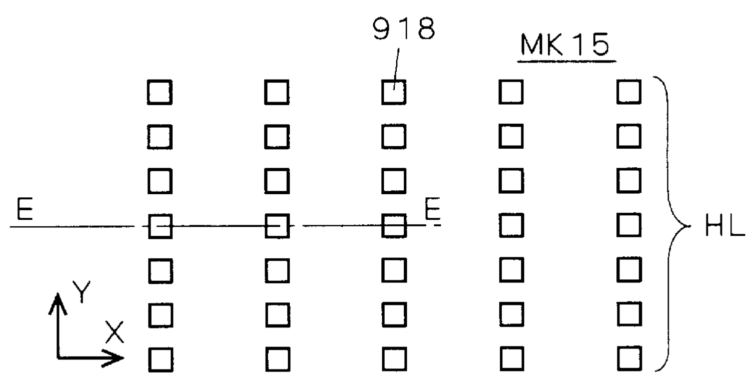

F/G. 35
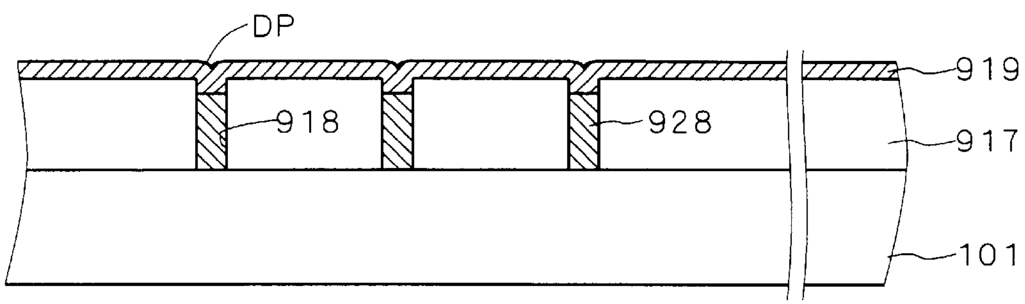
F/G. 36
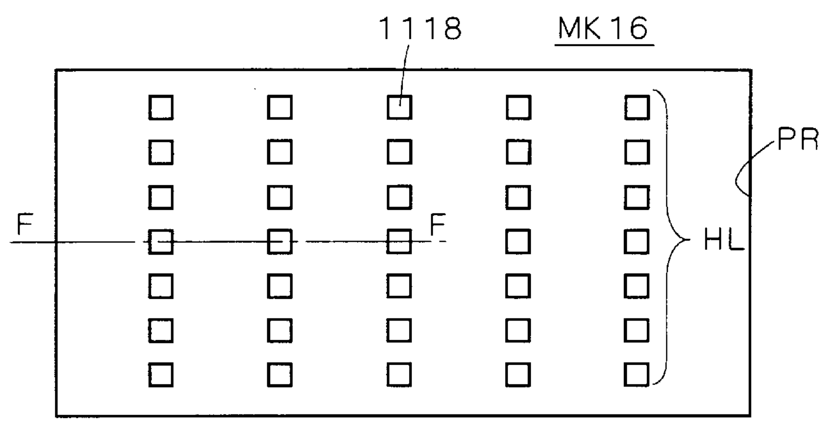
F/G. 37
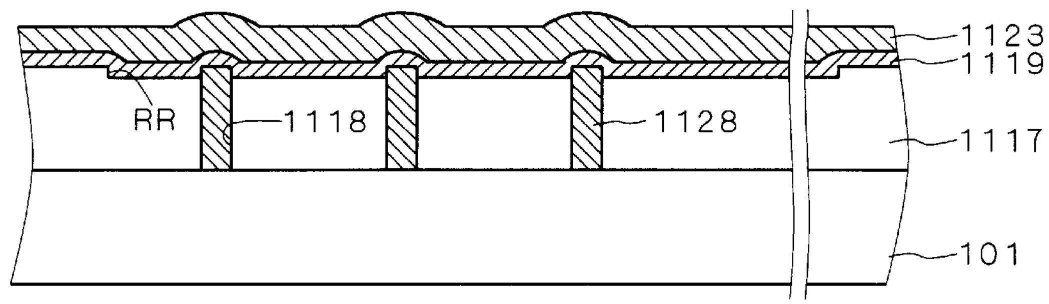

F/G. 38
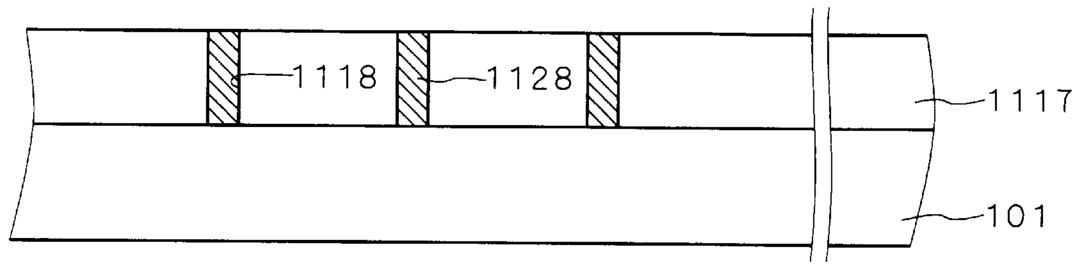
F/G. 39
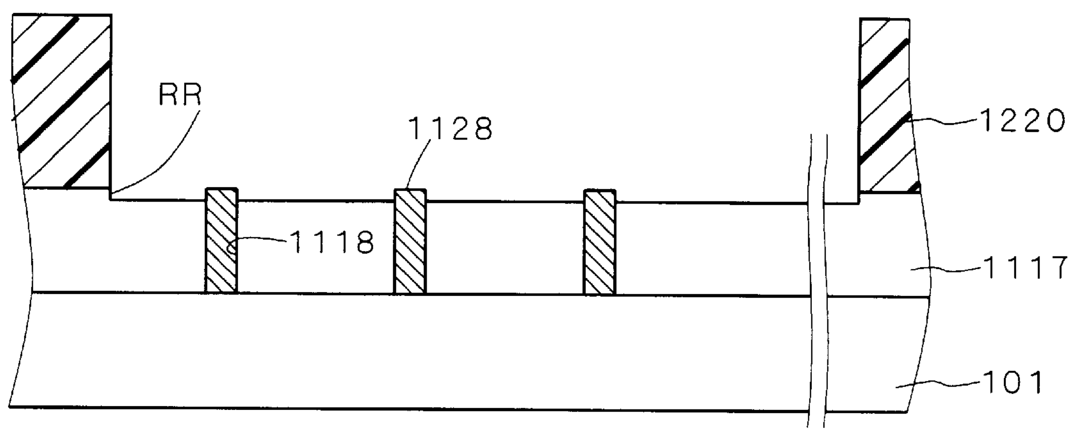
F/G. 40
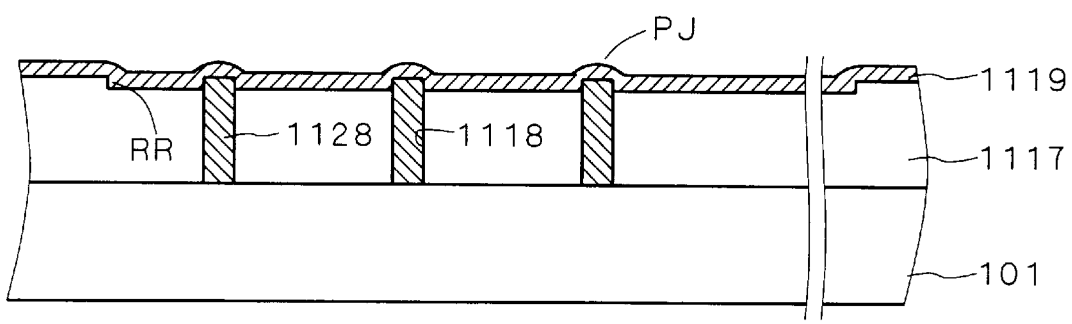

F/G. 41 (BACKGROUND ART)
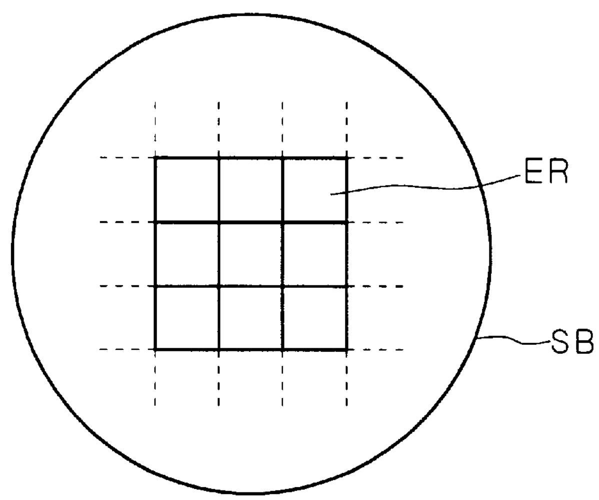
F/G. 42 (BACKGROUND ART)
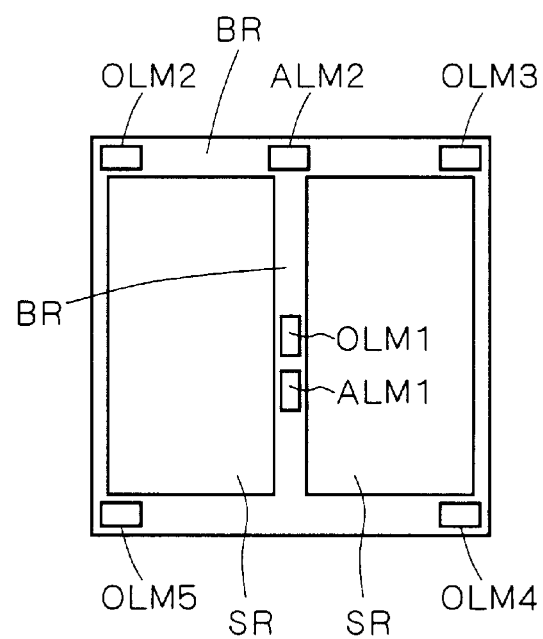

F/G. 43 (BACKGROUND ART)
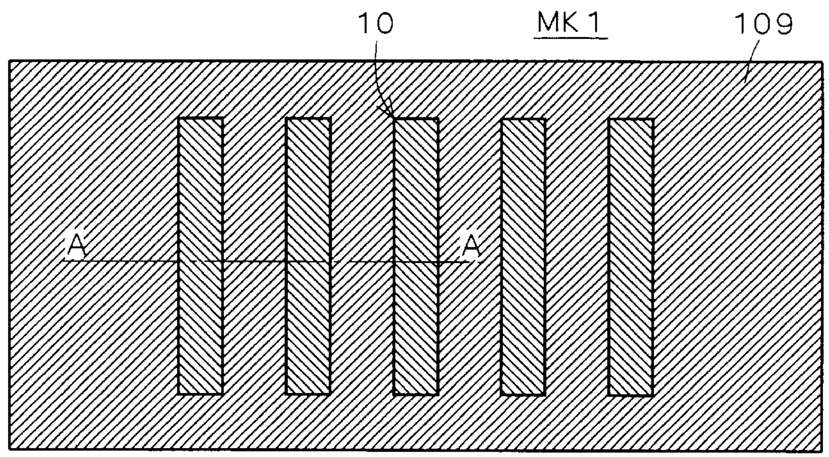
F/G. 44 (BACKGROUND ART)
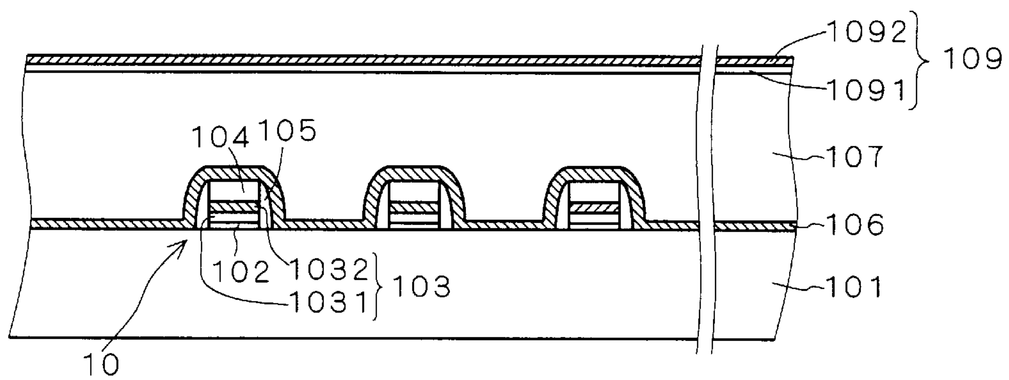
F/G. 45 (BACKGROUND ART)
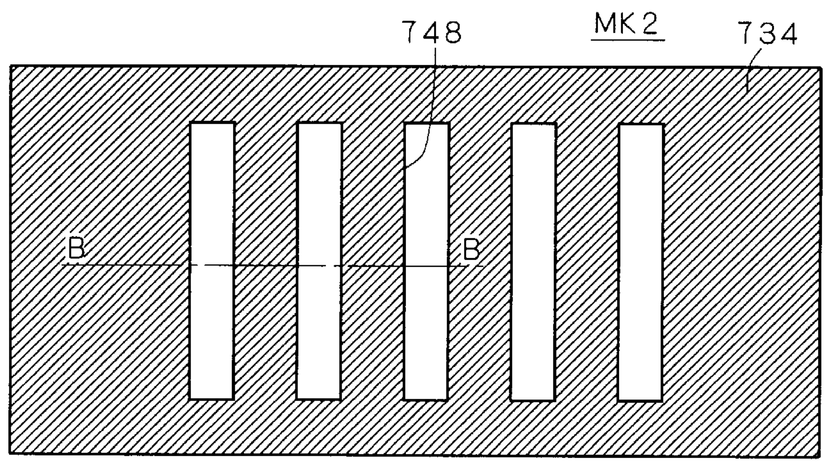

POSITION CHECK MARK

BACKGROUND OF THE INVENTION

1. Field of the Invention

The present invention relates to a semiconductor device and a method of manufacturing the same, and more particularly to an improvement in alignment of semiconductor device formed by overlaying a plurality of layers.

2. Description of the Background Art

Recently, with high integration of elements, the design rule becomes smaller and a manufacturing process becomes more complicated with planarization technique and use of new materials. Since miniaturization of contact holes and interconnections requires higher precision in alignment of the contact holes and the interconnections and therefore a higher alignment technique is needed.

To form contact holes and interconnections, an exposure device termed a stepper is used. A mask pattern projected by reducing projection lens system is repeatedly exposed while moving in an XY direction, to form a plurality of circuit patterns on a whole surface of a semiconductor substrate.

FIG. 41 schematically shows an operation of the stepper in a lithography process. As shown in FIG. 41, a plurality of exposure regions ER each of which is projected by one exposure are formed on a whole surface of a semiconductor substrate SB. A plurality of exposures are made on each exposure region ER, overlaying different patterns, to form a semiconductor device.

In overlay of patterns, an alignment mark for alignment is needed and after overlay, an overlay check mark is needed to check if the overlay is made properly. Each exposure region ER is provided with these marks.

In general, most part of the exposure region is an element formation region in which a plurality of semiconductor elements are formed and the rest blank part is used for forming the alignment mark and the overlay check mark. FIG. 42 shows a schematic structure of the exposure region ER. In FIG. 42, two element formation regions SR are placed at an interval and an overlay check mark OLM1 and an alignment mark ALM1 are provided in a blank portion BR between the two element formation regions SR and overlay check marks OLM2 to OLM5 are provided in the four corners of a blank portion BR surrounding the two element formation regions SR. Further, between the overlay check mark OLM2 and OLM3 provided is an alignment mark ALM2.

Though the five overlay check marks and the two alignment marks are shown in FIG. 42, the number of either mark is not limited to the above numbers. Further, since the present invention can be applied to both the alignment mark and the overlay check mark, the alignment mark and the overlay check mark are not distinguished from each other and both marks are generally referred to as position check mark in the discussion hereinafter (including discussion of the preferred embodiment of the invention).

FIG. 43 is a plan view of a position check mark MK1 as an example of position check mark. As shown in FIG. 43, the position check mark MK1 consists of a plurality of mark structures 10 which are each of elongated shape having a predetermined length and arranged in parallel at intervals.

FIG. 44 is a cross sectional view taken along the line A—A of FIG. 43. As shown in FIG. 44, the mark structure 10 consists of a gate oxide film 102 (a thermal oxide film having a thickness of about 10 nm) formed on a silicon substrate 101, a gate wiring layer 103 formed on the gate oxide film 102, an insulating film 104 formed on the gate wiring layer 103 and a sidewall 105 formed in contact with side surfaces of the insulating film 104, the gate wiring layer 103 and the gate oxide film 102.

The gate wiring layer 103 is a polycide consisting of two layers, i.e., a doped polysilicon layer 1031 having a thickness of, e.g., 100 nm and a tungsten silicide (WSi) layer 1032 having a thickness of 100 nm. The insulating film 104 is made of a TEOS (Tetra Ethyl Orthosilicate) oxide film having a thickness of, e.g., about 200 nm, and the sidewall 105 is made of a TEOS oxide film having a thickness of, e.g., 50 nm.

A stopper insulating film 106 is so provided as to cover an arrangement of mark structures 10 each having the above structure. The stopper insulating film 106 is a translucent silicon nitride film having a thickness of 50 nm. An interlayer insulating film 107 is formed of a TEOS oxide film having a thickness of e.g., 500 nm, covering the stopper insulating film 106, and its outermost surface is planarized by CMP (Chemical Mechanical Polishing).

On the interlayer insulating film 107, an opaque bit line layer 109 is formed as a polycide of a doped polysilicon layer 1091 having a thickness of, e.g., 100 nm and a tungsten silicide (WSi) layer 1092 having a thickness of 100 nm.

A mark structure 10 substantially has the same structure as a gate of a MOS transistor, for it is formed through the same process steps as the gate of the MOS transistor when the MOS transistor is formed as one of semiconductor elements in the element formation region SR of FIG. 42, and this is a technique for preventing an increase in the number of process steps by steps dedicated to formation of the position check mark MK1. Therefore, the mark structure 10 is a dummy gate and has no function of gate.

The stopper insulating film 106 serves as an etching stopper in formation of the contact hole penetrating the interlayer insulating film 107 to reach the semiconductor substrate 101 in the element formation region SR in a self-align manner, and is also provided in formation of the MOS transistor in the element formation region SR.

The interlayer insulating film 107 is also formed in the element formation region SR, and on the interlayer insulating film 107 planarized by CMP, the bit line layer 109 is formed.

Thus, since the mark structure 10 is formed in the same manner as the gate of the MOS transistor and on the mark structure 10, the opaque bit line layer 109 is formed with the planarized interlayer insulating film 107 interposed therebetween, the following problem arises.

When the bit line layer 109 is patterned to form a predetermined bit-line pattern, a mask pattern of the stepper is aligned by using the position check mark MK1 consisting of the mark structures 10. After the bit-line pattern is formed, the position check mark MK1 is used to check if the pattern is overlaid on a proper position. In both cases, since the mark structures 10 are measured through the opaque bit line layer 109 and the bit line layer 109 hardly transmits the visible light used in the measurement, the level difference of the mark structure 10 can hardly be measured. Further, since the interlayer insulating film 107 is planarized, disadvantageously, the existences of the mark structures 10 can not be seen from the interlayer insulating film 107.

Furthermore, affected by the translucent stopper insulating film 106, the intensity of the visible light used for the measurement is lowered and the contrast is worsened, disadvantageously not to allow a measurement with high precision.

Though the position check mark MK1 consisting of arranged mark structures 10 each of which substantially has the same structure as the gate of the MOS transistor has been discussed above, the structure of the mark structure is not limited to the gate structure.

FIG. 45 is a plan view of a position check mark MK2 as an example of a mark. As shown in FIG. 45, the position check mark MK2 consists of elongated openings having a predetermined length arranged in parallel at intervals on an oxide film 734.

FIG. 46 is a cross sectional view taken along the line B—B of FIG. 45. As shown in FIG. 46, the position check mark MK2 consists of openings OP where an interlayer insulating film 717 formed on the silicon substrate 101 is selectively removed in a rectangular shape to partially expose the silicon substrate 101 and a doped polysilicon layer 733 buried in the openings OP, having a thickness of 50 nm, and the oxide film 734 formed on the doped polysilicon layer 733. Further, an insulating film 726 is formed between a main surface of the interlayer insulating film 717 and the doped polysilicon layer 733. The oxide film 734 does not completely fill the opening and an opening 748 corresponding to the opening OP is formed. Further, sidewalls 735 are formed on walls of the opening 748.

The interlayer insulating film 717 is formed of a TEOS oxide film having a thickness of, e.g., 500 nm and its outermost surface is planarized by CMP. The insulating film 726 is a translucent silicon nitride film having a thickness of 50 nm and the oxide film 734 is a BPTEOS (boro-phospho TEOS) film having a thickness of 600 nm. The sidewall 735 is formed of a doped polysilicon having a thickness of, e.g., 50 nm.

Herein, a stacked capacitor SC corresponding to the position check mark MK2 in the element formation region SR of FIG. 42 will be discussed with reference to FIG. 47. As shown in FIG. 47, the stacked capacitor SC consists of a contact hole 708 selectively so formed as to penetrate the interlayer insulating film 717 and the insulating film 726, a bottom storage node 733 so provided as to fill the contact hole 708, a storage node core 734 formed on the bottom storage node 733 and the sidewall 735 so formed as to surround the storage node core 734.

Thus, the insulating film 726, the doped polysilicon layer 733, the oxide film 734 and the sidewall 735 of the position check mark MK2 correspond to the insulating film 726, the bottom storage node 733, the storage node core 734 and the sidewall 735 of the stacked capacitor SC and formed through the same steps, respectively. Further, though the opening OP of the position check mark MK2 is formed through the same step as the contact hole 708 of the stacked capacitor SC, these are greatly different in size, specifically, in that the contact hole 708 has an opening size of, e.g., about 0.2 $\mu$m and the opening OP has a size of, e.g., 2 $\mu$m or larger.

Now, existence of the sidewall 735 formed on the wall of the opening 748 of the position check mark MK2 causes a problem. In the stacked capacitor SC, the storage node core 734 is not needed, and the storage node core 734 is removed by selective etching using, e.g., vapor hydrofluoric acid, a dielectric film is formed along an outline of the bottom storage node 733 and the sidewall 735 and a counter electrode to the bottom storage node 733, termed cell plate, is formed along an outline of the dielectric film, to complete a storage node.

When the storage node core 734 is removed, the oxide film 734 of the position check mark MK2 is also removed. With this, when the sidewall 735 is removed off and the removed thing adheres to the element formation region SR, this develops a short circuit of the elements, disadvantageously resulting in defectives and remarked deterioration in manufacturing process yield.

Thus, in the method of manufacturing a semiconductor device in the background art, the alignment mark and the overlay check mark can not be measured or can be measured with much lower precision in the lithography process. In some structures of mark, when the mark is formed concurrently with the semiconductor device, unnecessary structure for the mark is also formed attendantly and this unnecessary structure becomes an extraneous matter in the manufacturing process of the semiconductor device, resulting in defectives of the semiconductor device and deterioration in manufacturing process yield.

SUMMARY OF THE INVENTION

The present invention is directed to a semiconductor device. According to a first aspect of the present invention, the semiconductor device comprises: a semiconductor substrate; a semiconductor element formed on the semiconductor substrate by overlaying a plurality of patterned layers; and a position check mark used for overlay of the plurality of layers, where the semiconductor element has a first wiring layer; an interlayer insulating film covering the first wiring layer; and a second wiring layer formed on the interlayer insulating film, and where the position check mark has an opening provided by selectively removing the interlayer insulating film; a mark structure formed in the opening, having the first wiring layer; and the second wiring layer placed along an outline of the mark structure.

According to a second aspect of the present invention, the second wiring layer is opaque or translucent, and projection and depression of the second wiring layer covering the mark structure are measured as a mark for position check when the second wiring layer is patterned.

According to a third aspect of the present invention, the semiconductor element includes a MOS transistor, the first wiring layer is a gate wiring layer, and the mark structure has the same structure as a gate of the MOS transistor.

According to a fourth aspect of the present invention, the semiconductor device comprises: a semiconductor substrate; a semiconductor element formed on the semiconductor substrate by overlaying a plurality of patterned layers; and a position check mark used for overlay of the plurality of layers, where the semiconductor element has a first wiring layer; a first interlayer insulating film covering the first wiring layer; a second interlayer insulating film formed on the first interlayer insulating film; and a second wiring layer formed at least on the second interlayer insulating film, and where the position check mark has an opening provided by selectively removing the first interlayer insulating film; a mark structure formed in the opening, having the first wiring layer; the second interlayer insulating film provided extending from on the first interlayer insulating film to on the mark structure, having an outline with projection and depression corresponding to an outline of the mark structure; and the second wiring layer placed along the outline of the second interlayer insulating film.

According to a fifth aspect of the present invention, the second wiring layer is opaque or translucent, and projection and depression of the second wiring layer constituting the position check mark are measured as a mark for position check when the second wiring layer is patterned.

According to a sixth aspect of the present invention, the semiconductor element is a memory element including a MOS transistor and a capacitor electrically connected to the MOS transistor, the first wiring layer is a gate wiring layer, the mark structure has the same structure of a gate of the MOS transistor, and the second wiring layer is a cell plate of the capacitor.

According to a seventh aspect of the present invention, the semiconductor device comprises: a semiconductor substrate; a semiconductor element formed on the semiconductor substrate by overlaying a plurality of patterned layers; and a position check mark used for overlay of the plurality of layers, where the semiconductor element has an interlayer insulating film formed on the semiconductor substrate; a contact hole penetrating the interlayer insulating film to reach the semiconductor substrate; and a first conductive film placed to fill at least the contact hole, and where the position check mark has a plurality of mark holes so formed as to penetrate the interlayer insulating film; and a second conductive film so placed as to fill at least the plurality of mark holes.

According to an eighth aspect of the present invention, the semiconductor element is a capacitor, the first conductive film is a storage node, the storage node is so provided as to protrude from the contact hole, the capacitor further has a first sidewall which is conductive and extends perpendicularly to the interlayer insulating film, surrounding a protruding portion of the storage node, the second conductive film which is part of a conductive film including the first conductive film, and is so formed on the interlayer insulating film as to fill the plurality of mark holes and extend over the plurality of mark holes, and the position check mark further has a second sidewall which is conductive, has almost the same structure as the first sidewall and extends perpendicularly to the interlayer insulating film, surrounding an outer peripheral edge portion of the second conductive film.

According to a ninth aspect of the present invention, the semiconductor device comprises: a semiconductor substrate; a semiconductor element formed on the semiconductor substrate by overlaying a plurality of patterned layers; and a position check mark used for overlay of the plurality of layers, where the semiconductor element has an interlayer insulating film formed on the semiconductor substrate; a contact hole penetrating the interlayer insulating film to reach the semiconductor substrate; a plug which is conductive and fills the contact hole; a barrier metal layer so provided as to cover the contact hole and to be electrically connected to the plug; and a conductive film formed on the barrier metal layer, and where the position check mark has a plurality of mark holes so formed as to penetrate the interlayer insulating film; a recess plug which is conductive and provided so that its one end portion on a side opposite to the semiconductor substrate is recessed in the plurality of mark holes; the barrier metal layer so provided as to cover the plurality of mark holes and to be electrically connected to the recess plug; and the conductive film formed on the barrier metal layer.

According to a tenth aspect of the present invention, the semiconductor device comprises: a semiconductor substrate; a semiconductor element formed on the semiconductor substrate by overlaying a plurality of patterned layers; and a position check mark used for overlay of the plurality of layers, where the semiconductor element has an interlayer insulating film formed on the semiconductor substrate; a contact hole penetrating the interlayer insulating film to reach the semiconductor substrate; a plug which is conductive and fills the contact hole; a barrier metal layer so provided as to cover the contact hole and to be electrically connected to the plug; and a conductive film formed on the barrier metal layer, and where the position check mark has a recess region in which a determined region of the interlayer insulating film is recessed; a plurality of mark holes so formed as to penetrate the interlayer insulating film in the recess region; a protrusion plug which is conductive and provided so that its one end portion on a side opposite to the semiconductor substrate protrudes from the plurality of mark holes; the barrier metal layer so provided as to cover the plurality of mark holes and to be electrically connected to the protrusion plug; and the conductive film formed on the barrier metal layer.

According to an eleventh aspect of the present invention, the opening size of each of the plurality of mark holes ranges from almost as large as that of the contact hole to almost twice.

According to a twelfth aspect of the present invention, the plurality of mark holes are formed through the same process as the contact hole.

The present invention is directed to a method of manufacturing a semiconductor device which comprises a semiconductor element formed on a semiconductor substrate by overlaying a plurality of patterned layers and a position check mark used for overlay of the plurality of layers. According to a thirteenth aspect of the present invention, the method comprises the steps of: (a) forming a first wiring layer on a first region in which the semiconductor element is formed on the semiconductor substrate and a second region which surrounds the first region with an insulating film interposed therebetween; (b) forming an upper oxide film and a sidewall oxide film in an upper portion and on a side surface of the first wiring layer, respectively; (c) so forming a nitride film as to cover the upper oxide film and the sidewall oxide film; (d) so forming an interlayer insulating film as to cover the first and second regions; (e) so forming a contact hole in a self-align manner as to penetrate the interlayer insulating film of the first region to reach at least the nitride film extending from on the sidewall oxide film to on the semiconductor substrate, and selectively removing the interlayer insulating film of the second region in accordance with a formation region of the position check mark to form an opening, thereby exposing the nitride film; (f) removing the nitride film exposing on a bottom of the contact hole and the opening to extend the contact hole to the semiconductor substrate and to leave a mark structure consisting of the insulating film, the first wiring layer, the upper oxide film and the side wall oxide film formed in the opening in the step (a) and (b); and (g) so forming a second wiring layer as to cover the first and second regions, burying the second wiring layer in the contact hole, and placing the second wiring layer along an outline of the mark structure at the same time, and in the method of the thirteenth aspect, the position check mark is formed in the steps (f) and (g).

According to a fourteenth aspect of the present invention, the method comprises the steps of: (a) forming a first wiring layer on a first region in which the semiconductor element is formed on the semiconductor substrate and a second region which surrounds the first region with an insulating film interposed therebetween; (b) forming an upper oxide film in an upper portion of the first wiring layer; (c) forming a sidewall oxide film on side surfaces of the first wiring layer and the upper oxide film in the first region; (d) so forming a nitride film as to cover the upper oxide film and the sidewall oxide film in the first region and the first wiring layer and the upper oxide film in the second region; (e) selectively removing the nitride film covering the first wiring layer and the upper oxide film in the second region to form a sidewall nitride film; (f) so forming an interlayer insulating film as to cover the first and second regions; (g) so forming a contact hole in a self-align manner as to penetrate the interlayer insulating film of the first region to reach at least the nitride film extending from on the sidewall oxide film to on the semiconductor substrate, selectively removing the interlayer insulating film of the second region in accordance with a formation region of the position check mark to provide an opening, exposing the nitride film, and removing the upper oxide film; (h) removing the nitride film exposing on bottoms of the contact hole and the opening to extend the contact hole to the semiconductor substrate and to leave a mark structure consisting of the insulating film, the first wiring layer and the side wall nitride film formed in the opening in the step (a), (b) and (e); and (i) so forming a second wiring layer as to cover the first and second regions, burying the second wiring layer in the contact hole, and placing the second wiring layer along an outline of the mark structure exposed in the opening at the same time, and in the method of the fourteenth aspect, the position check mark is formed in the steps (h) and (i).

According to a fifteenth aspect of the present invention, the method comprises the steps of: (a) so forming an interlayer insulating film as to cover a first region in which the semiconductor element is formed on the semiconductor substrate and a second region which surrounds the first region; (b) providing a contact hole which penetrates the interlayer insulating film of the first region to reach the semiconductor substrate, and forming a plurality of mark holes which penetrate the interlayer insulating film of the second region to reach the semiconductor substrate; (c) so forming a conductive film on the interlayer insulating film on the first and second regions as to fill the contact hole and the plurality of mark holes; (d) forming an insulating film on the conductive film; (e) so selectively removing the insulating film and the conductive film as to leave the insulating film on the contact hole and leave the conductive film on the plurality of mark holes and on between the plurality of mark holes; (f) forming sidewalls which are conductive on side surfaces of the conductive film and the insulating film on the contact hole and side surfaces of the conductive film and the insulating film on the plurality of mark holes and on between the plurality of mark holes; and (g) removing the insulating film, and in the method of the fifteenth aspect, the position check mark is formed in the steps (b) to (g).

According to a sixteenth aspect of the present invention, the method comprises the steps of: (a) so forming an interlayer insulating film as to cover a first region in which the semiconductor element is formed on the semiconductor substrate and a second region which surrounds the first region; (b) providing a contact hole which penetrates the interlayer insulating film of the first region to reach the semiconductor substrate, and forming a plurality of mark holes which penetrate the interlayer insulating film of the second region to reach the semiconductor substrate; (c) filling the contact hole and the plurality of mark holes with a plug which is conductive; (d) partially removing the plug so that one end portion of the plug in the plurality of mark holes on a side opposite to the semiconductor substrate is recessed in the plurality of mark holes, to form a recess plug; and (e) so placing a barrier metal layer as to cover the first and second regions and to be electrically connected to the plug in the contact hole and the recess plug in the plurality of mark holes, and then forming a conductive film on the barrier metal layer, and in the method of the sixteenth aspect, the position check mark is formed in the steps (b) to (e).

According to a seventeenth aspect of the present invention, the method comprises the steps of: (a) so forming an interlayer insulating film as to cover a first region in which the semiconductor element is formed on the semiconductor substrate and a second region which surrounds the first region; (b) providing a contact hole which penetrates the interlayer insulating film of the first region to reach the semiconductor substrate, and forming a plurality of mark holes which penetrate the interlayer insulating film of the second region to reach the semiconductor substrate; (c) filling the contact hole and the plurality of mark holes with a plug which is conductive; (d) recessing a predetermined region in the interlayer insulating film of the second region in which the plurality of mark holes are formed to form a recess region and protruding one end portion of the plug on a side opposite to the semiconductor substrate from the plurality of mark holes, to form a protrusion plug; and (e) so placing a barrier metal layer as to cover the first and second regions and to be electrically connected to the plug in the contact hole and the protrusion plug protruding from the plurality of mark holes, and then forming a conductive film on the barrier metal layer, and in the method of the seventeenth aspect, the position check mark is formed in the steps (b) to (e).

According to an eighteenth aspect of the present invention, the step (b) includes a step of setting the opening size of each of the plurality of mark holes from almost as large as that of the contact hole to almost twice.

According to a nineteenth aspect of the present invention, the step of forming the interlayer insulating film includes a step of planarizing the interlayer insulating film by CMP (Chemical Mechanical Polishing).

In the semiconductor device of the first aspect of the present invention, since the second wiring layer is placed along an outline of the mark structure, the level difference of the mark structure is left as projection and depression of the second wiring layer and the mark structure can be measured indirectly through the second wiring layer. Therefore, for example, when the second wiring layer is patterned to form a predetermined interconnection pattern, the mark structure is measured indirectly through the second wiring layer to make an alignment of mask pattern of the stepper, and after the predetermined interconnection pattern is formed, the position check mark is used to check if the pattern is overlaid on a proper position.

In the semiconductor device of the second aspect of the present invention, if the second wiring layer is opaque or translucent, when the second wiring layer is patterned, by measuring the projection and depression of the second wiring layer covering the mark structure as the mark structure, the mark structure can be measured indirectly through the second wiring layer to avoid defectiveness such as misalignment.

In the semiconductor device of the third aspect of the present invention, since the mark structure has the same structure as the gate of the MOS transistor, the mark structure can be formed in the process of manufacturing the MOS transistor and a whole manufacturing process is simplified as compared with a case where a dedicated process of forming the position check mark is established.

In the semiconductor device of the fourth aspect of the present invention, since the position check mark has the second interlayer insulating film having an outline with projection and depression corresponding to the outline of the mark structure and the second wiring layer placed along the outline of the second interlayer insulating film, the level difference of the mark structure is left as the level difference in projection and depression of the second interlayer insulating film and further as the level difference in projection and depression of the second wiring layer, and the mark structure can be measured indirectly through the second wiring layer. Therefore, for example, when the second wiring layer is patterned to form a predetermined interconnection pattern, the mark structure is measured indirectly through the second wiring layer to make an alignment of mask pattern of the stepper, and after the predetermined interconnection pattern is formed, the position check mark is used to check if the pattern is overlaid on a proper position.

In the semiconductor device of the fifth aspect of the present invention, if the second wiring layer is opaque or translucent, when the second wiring layer is patterned, by measuring the projection and depression of the second wiring layer covering the mark structure as the mark structure, the mark structure can be measured indirectly through the second wiring layer to avoid defectiveness such as misalignment.

In the semiconductor device of the sixth aspect of the present invention, since the mark structure has the same structure as the gate of the MOS transistor and the second wiring layer has the same structure as the cell plate of the capacitor, a manufacturing process is simplified as compared with a case where a dedicated process of forming the position check mark is established.

In the semiconductor device of the seventh aspect of the present invention, the position check mark has a plurality of mark holes so formed as to penetrate the interlayer insulating film and the second conductive film so formed as to fill at least a plurality of mark holes, the position check mark is a hole-shaped mark and suitable for formation of a semiconductor element having the first conductive film in the contact hole. Specifically, when a hole-shaped pattern is overlaid by using a hole-shaped mark, an influence of coma aberration can be reduced to lessen misalignment of the pattern as compared with the case where alignment of the hole-shaped pattern is made by using the line-shaped mark.

In the semiconductor device of the eighth aspect of the present invention, when the semiconductor element is a capacitor, by setting the opening size of the mark hole almost as large as that of the contact hole, the same structure as the capacitor is formed on an upper portion of the mark hole through the process of forming the capacitor. Specifically, in the capacitor having a structure in which a protruding portion of the storage node is surrounded by the first sidewall, since the position check mark is formed through the same step as the first sidewall to have the second sidewall which is conductive and extends perpendicularly to the interlayer insulating film, surrounding an outer peripheral edge portion of the second conductive film, the second conductive film and the second sidewall are united and when an insulating film needed only in the manufacturing process is formed in a region defined by the second conductive film and the second sidewall, even if the insulating film is removed, there arises no phenomenon where the second sidewall is removed, floating, for example, in an etchant solution, and it is possible to prevent short circuit of the semiconductor element by the second sidewall, which leads to defectiveness and deterioration in manufacturing process yield.

In the semiconductor device of the ninth aspect of the present invention, since the position check mark has a plurality of mark holes so formed as to penetrate the interlayer insulating film and a conductive recess plug formed so that its end portion on a side opposite to the semiconductor substrate may be recessed in the plurality of mark holes and the barrier metal layer is so formed as to be electrically connected to the recess plug, a surface of the barrier metal corresponding to the positions of the mark holes has depressions and further the conductive film thereon has depressions, and therefore the position check mark consisting of the mark holes can be measured with high precision. Further, a hole-shaped pattern is overlaid by using a hole-shaped mark, and an influence of coma aberration can be reduced to lessen misalignment of the pattern as compared with the case where alignment of the hole-shaped pattern is made by using the line-shaped mark.

In the semiconductor device of the tenth aspect of the present invention, since the position check mark has a recess region in which a predetermined region of the interlayer insulating film is recessed, a plurality of mark holes so formed as to penetrate the interlayer insulating film in the recess region and a conductive protrusion plug formed so that its end portion on a side opposite to the semiconductor substrate may protrude from the plurality of mark holes and the barrier metal layer is so formed as to be electrically connected to the protrusion plug, surfaces of the barrier metal layer and the conductive film thereon corresponding to the positions of the mark holes have projections, and therefore the position check mark consisting of the mark holes can be measured with high precision even if the barrier metal and the conductive film are opaque. Further, a hole-shaped pattern is overlaid by using a hole-shaped mark, and an influence of coma aberration can be reduced to lessen misalignment of the pattern as compared with the case where alignment of the hole-shaped pattern is made by using the line-shaped mark.

In the semiconductor device of the eleventh aspect of the present invention, since the opening size of each of a plurality of mark holes ranges from almost as large as that of the contact hole to almost twice, a plurality of mark holes can be filled in the same manner as the contact hole and the position check mark having the same structure as the semiconductor element can be obtained.

In the semiconductor device of the twelfth aspect of the present invention, since a plurality of mark holes are formed through the same process as the contact hole, a manufacturing process is simplified as compared with a case where a dedicated process of forming the mark holes is established.

By the method of manufacturing a semiconductor device of the thirteenth and fourteenth aspects of the present invention, the position check mark in which the second wiring layer is formed along an outline of the mark structure to leave the level difference of the mark structure as the projection and depression of the second wiring layer and therefore the mark structure can be measured indirectly through the second wiring layer can be obtained through the same manufacturing process as the semiconductor element.

By the method of the fifteenth aspect of the present invention, the position check mark having the second interlayer insulating film having an outline with projection and depression corresponding to the outline of the mark structure and the second wiring layer formed along the outline of the second interlayer insulating film, in which the level difference of the mark structure is left as the level difference in projection and depression of the second interlayer insulating film and further as the level difference in projection and depression of the second wiring layer and therefore the mark structure can be measured indirectly through the second wiring layer can be obtained through the same manufacturing process as the semiconductor element.

By the method of the sixteenth aspect of the present invention, the position check mark in which a surface of the barrier metal has depressions corresponding to the positions of the mark holes and further the conductive film thereon has depressions and therefore the position check mark consisting of the mark holes can be measured with high precision can be obtained through the same manufacturing process as the semiconductor element.

By the method of the seventeenth aspect of the present invention, the position check mark in which surfaces of the barrier metal and the conductive film thereon have projections corresponding to the positions of the mark holes and therefore the position check mark consisting of the mark holes can be measured with- high precision can be obtained through the same manufacturing process as the semiconductor element.

In the method of the eighteenth aspect of the present invention, by setting the opening size of each of a plurality of mark holes from almost as large as that of said contact hole to almost twice, a plurality of mark holes can be filled in the same manner as the contact hole and the position check mark having the same structure as the semiconductor element can be obtained.

In the method of the nineteenth aspect of the present invention, since the interlayer insulating film is planarized by CMP, the interlayer insulating film can be planarized with high precision and downsizing of the semiconductor device is facilitated.

An object of the present invention is to provide a semiconductor device which allows a reliable measurement of an alignment mark and an overlay check mark with high precision in a lithography process and avoids formation of unnecessary structure for mark, suppressing creation of extraneous matters, to prevent deterioration in manufacturing process yield, and a method of manufacturing the same.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 1 is a plan view showing a structure of a mark in accordance with a first preferred embodiment of the present invention;

FIG. 2 is a cross section showing the structure of the mark in accordance with the first preferred embodiment of the present invention;

FIGS. 3 to 5 show a process of manufacturing the mark in accordance with the first preferred embodiment of the present invention;

FIGS. 6 to 9 show a process of manufacturing a semiconductor element in accordance with the first preferred embodiment of the present invention;

FIGS. 10 and 11 are cross sections showing variations of the structure of the mark in accordance with the first preferred embodiment of the present invention;

FIG. 12 is a plan view showing a structure of a mark in accordance with a second preferred embodiment of the present invention;

FIG. 13 is a cross section showing the structure of the mark in accordance with the second preferred embodiment of the present invention;

FIGS. 14 to 16 show a process of manufacturing the mark in accordance with the second preferred embodiment of the present invention;

FIG. 17 is a plan view showing a structure of a mark in accordance with a third preferred embodiment of the present invention;

FIG. 18 is a cross section showing the structure of the mark in accordance with the third preferred embodiment of the present invention;

FIG. 19 is a cross section showing the structure of a semiconductor element in accordance with the third preferred embodiment of the present invention;

FIGS. 20 to 23 show a process of manufacturing the mark in accordance with the third preferred embodiment of the present invention;

FIG. 24 is a plan view showing a structure of a mark in accordance with a fourth preferred embodiment of the present invention;

FIG. 25 is a cross section showing the structure of the mark in accordance with the fourth preferred embodiment of the present invention;

FIG. 26 is a cross section showing the structure of a semiconductor element in accordance with the fourth preferred embodiment of the present invention;

FIGS. 27 to 30 show a process of manufacturing the mark in accordance with the fourth preferred embodiment of the present invention;

FIG. 31 is a plan view showing a structure of a mark in accordance with a fifth preferred embodiment of the present invention;

FIGS. 33 to 35 show a process of manufacturing the mark in accordance with the fifth preferred embodiment of the present invention;

FIG. 36 is a plan view showing a structure of a mark in accordance with a sixth preferred embodiment of the present invention;

FIG. 37 is a cross section showing the structure of the mark in accordance with the sixth preferred embodiment of the present invention;

FIGS. 38 to 40 show a process of manufacturing the mark in accordance with the sixth preferred embodiment of the present invention;

FIG. 41 schematically shows an operation of a stepper in a lithography process;

FIG. 42 shows a schematic structure of an exposure region;

FIG. 43 is a plan view showing a mark in the background art;

FIG. 44 is a cross section showing a mark in the background art;

FIG. 45 is a plan view showing a mark in the background art;

DESCRIPTION OF THE PREFERRED EMBODIMENTS

A. The First Preferred Embodiment

<A-1. Device Structure>

Figure 32:
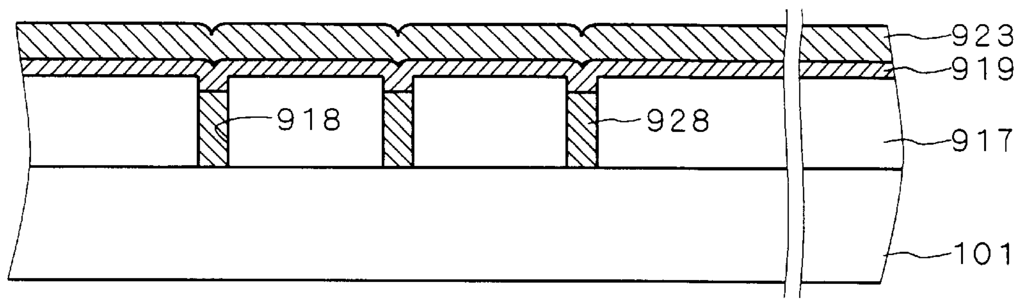
FIG. 32 is a cross section showing the structure of the mark in accordance with the fifth preferred embodiment of the present invention.

Referring to FIGS. 1 and 2, a structure of a mark of a semiconductor device in accordance with the first preferred embodiment will be discussed. FIG. 1 is a plan view of a position check mark MK11. As shown in FIG. 1, the position check mark MK11 consists of a plurality of elongated mark structures 100 having a predetermined length arranged in parallel at intervals in a rectangular opening 108.

FIG. 2 is a cross sectional view taken along the line A—A of FIG. 1. As shown in FIG. 2, the mark structure 100 is formed on the silicon substrate 101 (e.g., a P-type silicon substrate having resistivity of 10 Ω·cm) inside the opening 108 formed by selectively removing the stopper insulating film 106 and the interlayer insulating film 107 formed on the silicon substrate 101.

The mark structure 100 consists of the gate oxide film 102 (a thermal oxide film having a thickness of about 10 nm) formed on the silicon substrate 101, the gate wiring layer 103 (a first wiring layer) formed on the gate oxide film 102, the insulating film 104 formed on the gate wiring layer 103 and the sidewall 105 formed in contact with side surfaces of the insulating film 104, the gate wiring layer 103 and the gate oxide film 102.

The mark structure 100 substantially has the same structure as a gate of an MOS transistor, for it is concurrently formed through the same manufacturing process steps as the gate of the MOS transistor when the MOS transistor is formed as one of semiconductor elements in the element formation region (see FIG. 42), but the mark structure 100 has no function of gate. Therefore, the mark structure 100 is a dummy gate.

The gate wiring layer 103 is a polycide consisting of two layers, i.e., a doped polysilicon layer 1031 having a thickness of, e.g., 100 nm and a tungsten silicide (WSi) 1032 layer having a thickness of 100 nm. The insulating film 104 is made of a TEOS (Tetra Ethyl Orthosilicate) oxide film having a thickness of, e.g., about 200 nm, and the sidewall 105 is made of a TEOS oxide film having a thickness of, e.g., 50 nm. The stopper insulating film 106 is a translucent silicon nitride film having a thickness of 50 nm. The interlayer insulating film 107 is formed of a TEOS oxide film having a thickness of, e.g., 500 nm and its outermost surface is planarized by CMP (Chemical Mechanical Polishing).

An opaque bit line layer 113 (a second wiring layer) is formed, extending from on the interlayer insulating film 107 to on the mark structure 100, as a polycide consisting of a doped polysilicon layer 1131 having a thickness of, e.g., 100 nm and a tungsten silicide (WSi) layer 1132 having a thickness of 100 nm.

FIG. 1 does not faithfully show a view of the structure of FIG. 2 from above, omitting the bit line layer 113 inside the opening 108, for easy understanding of the opening 108 and the arrangement of the mark structures 100.

<A-2. Function and Effect>

Since the bit line layer 113 is formed along an outline of the mark structure 100, covering an upper portion of the interlayer insulating film 107, a side surface of the interlayer insulating film 107 defining the opening 108 and the silicon substrate 101 at the bottom of the opening 108, the level difference of the mark structure 100 is left as a projection and depression of the bit line layer 113 and the mark structure 100 can be measured indirectly through the bit line layer 113.

Therefore, when, for example, the bit line layer 113 is patterned to form a predetermined bit-line pattern, an alignment of the mask pattern of a stepper is made by using the position check mark MK11 consisting of mark structures 100 and after the bit line pattern is formed, the position check mark MK11 is used to check if the pattern is overlaid on a proper position, and at this time, regardless of whether the bit line layer 113 is opaque or not, the level difference of the mark structure 100 can be reliably measured, to prevent defectiveness such as misalignment due to unmeasured mark.

The translucent stopper insulating film 106 serving as an etching stopper in formation of the contact hole penetrating the interlayer insulating film 107 to reach the semiconductor substrate 101 in a self-align manner in the element formation region is not formed on the mark structures 100. Therefore, since the intensity of the visible light used for the measurement is not lowered due to the existence of the stopper insulating film 106 to prevent deterioration in contrast of the position check mark MK11 and no change in contrast is caused by variation in thickness of the stopper insulating film 106, a measurement of mark can be performed with high precision.

<A-3. Manufacturing Method>

A method of manufacturing a semiconductor device having the position check mark MK11 discussed with reference to FIGS. 1 and 2 will be discussed now, with reference to FIGS. 3 to 9 showing the process step by step.

First, a silicon oxide film serving as the gate oxide film 102 of FIG. 3 is formed on the silicon oxide film 101 to have a thickness of 10 nm, and a polycide layer serving as the gate wiring layer 103 is formed by layering a doped polysilicon layer having a thickness of, e.g., 100 nm and a tungsten silicide layer having a thickness of 100 nm. A TEOS oxide film serving as the insulating film 104 is formed on the polycide layer to have a thickness of, e.g., 200 nm, and a resist mask formed over the TEOS oxide film is selectively etched to form the insulating film 104. After that, using the insulating film 104 as a mask, the lower layers are selectively etched. Subsequently, a TEOS film is formed entirely to have a thickness of, e.g., 50 nm and the TEOS oxide film is so selectively etched as to be left only on side surfaces of the insulating film 104, the gate wiring layer 103 and the gate oxide film 102, to form the sidewall 105. Thus, the mark structure 100 is formed.

Next, the stopper insulating film 106 is formed entirely of a silicon nitride film to have a thickness, e.g., 50 nm. A TEOS oxide film is formed on the stopper insulating film 106 to have a thickness of, e.g., 600 nm and the TEOS oxide film is polished by about 100 nm by CMP to achieve the interlayer insulating film 107 of FIG. 3.

Subsequently, in a step of FIG. 4, a resist 210 is so patterned on the interlayer insulating film 107 as to remove the interlayer insulating film 107 in a portion where the mark structures 100 are formed. Then, with the resist 210 as a mask, the interlayer insulating film 107 is selectively removed by dry etching or the like to form the opening 108.

Since the stopper insulating film 106 is made of a nitride film so as not to be removed by etching for the interlayer insulating film 107, the interlayer insulating film 107 can be removed without crumbling the shapes of the insulating film 104 and the gate wiring layer 103 in the lower portion.

Subsequently, in a step of FIG. 5, the stopper insulating film 106 in the opening 108 is removed to expose the mark structure 100.

An etching of the stopper insulating film 106 is made under a condition such that the silicon substrate 101 is etched as little as possible, such as by dry etching with $CF_4$ or the like as the etching gas.

Finally, the doped polysilicon 1131 having a thickness of, e.g., 100 nm and the tungsten silicide layer 1132 having a thickness of 100 nm are layered in this order to form the bit line layer 113. Thus, the position check mark MK11 of FIG. 2 is achieved.

A process of manufacturing a MOS transistor in the element formation region (see FIG. 42), corresponding to the process of FIGS. 3 and 4, will be discussed with reference to FIGS. 6 to 9.

In the same step as that of FIG. 3, a gate structure GT is formed on the silicon substrate 101, as shown in FIG. 6. Though FIG. 6 shows a case where two gate structures GT are arranged at an interval, this is an example.

It goes without saying that a structure of the gate structure GT is the same as that of the mark structure 100. It also goes without saying, however, that the interval of arrangement in the gate structure GT is much smaller than that of the mark structure 100 in many cases.

Further, the stopper insulating film 106 and the interlayer insulating film 107 are layered on the gate structure GT.

Subsequently, in the same step as that of FIG. 4, the resist 210 having a hole pattern over two gate structures GT is patterned on the interlayer insulating film 107, as shown in FIG. 7, and the interlayer insulating film 107 is selectively removed by dry etching and the like with the resist 210 as a mask, to form a contact hole CH1.

As discussed earlier, since the stopper insulating film 106 is made of a nitride film so as not to be removed by etching for the interlayer insulating film 107, the gate structure GT in the lower portion is not etched and the contact hole CH1 is formed with the arrangement pattern of the gate structure GT in a self-align manner.

Subsequently, in the same step as that of FIG. 5, the stepper insulating film 106 in the contact hole CH1 is removed to expose the gate structure GT, as shown in FIG. 8.

Finally, in a step of FIG. 9, the doped polysilicon 1131 having a thickness of, e.g., 100 nm and the tungsten silicide layer 1132 having a thickness of 100 nm are layered in this order, from on the interlayer insulating film 107 to on the gate structure GT, to form the bit line layer 113. Thus, by forming the bit line layer 113, the bit line layer 113 is connected to the silicon layer 101, to complete the MOS transistor.

In the surface of the silicon substrate 101 to which the bit line layer 113 is connected, after formation of the sidewall 105, a semiconductor impurity is implanted in advance (this step is not discussed).

Further, the semiconductor element is not limited to the MOS transistor. For example, after a stacked capacitor and the like is formed above the interlayer insulating film 107 to complete a predetermined semiconductor element, a margin surrounding the element formation region is defined as a dicing line and the element formation region is divided so that each element formation region may be a semiconductor chip. Therefore, though no trace is left on the semiconductor chip in some cases depending on the size of mark and its forming position, the mark usually leaves some traces on the semiconductor chip even if partially.

Thus, in this preferred embodiment, since the position check mark MK11 is formed through the same process as the MOS transistor is formed in the element formation region, formation of the position check mark MK11 increases neither the number of steps nor manufacturing cost. Further, since the formed position check mark MK11 is not covered with the interlayer insulating film 107 to leave the level difference of the mark structure 100 as projection and depression of the bit line layer 113, the mark structures 100 can be measured indirectly through the bit line layer 113.

Further, since the translucent stopper insulating film 106 is not formed above the mark structures 100, the existence of the stopper insulating film 106 does not lower the intensity of the visible light used for the measurement to prevent deterioration in contrast of the position check mark MK11 and no change in contrast is caused by variation in thickness of the stopper insulating film 106. Therefore, a measurement of mark can be performed with high precision.

<A-4. Variation>

Though the above discussion is made on a case where the opening 108 of the position check mark MK11 is formed through the same step as the contact hole CH1 in the process of manufacturing the MOS transistor in the element formation region, the opening 108 may be formed by using a mask dedicated to the mark.

Further, though the above discussion is made on a case where planarization of the interlayer insulating film 107 is performed by CMP, the planarization may be performed by APL (Applied Planarization) or the interlayer insulating film 107 may be formed by SOG (Spin On Glass) coating or reflow of BPSG (Boro-Phospho Silicate Glass) or BPTEOS and etched back for planarization.

Furthermore, though the above discussion is made on a case where the interlayer insulating film 107 is planarized, the present invention can be effective on a not-planarized interlayer insulating film. Specifically, as shown in FIG. 10, when a TEOS oxide film is formed to have a thickness of, e.g., 600 nm and no planarization is made, the projection and depression of the mark structure 100 appear as those of an interlayer insulating film 107A. Therefore, though the projection and depression may be measured as a mark, in some cases, depending on the thickness of the interlayer insulating film, the projection and depression are unclear and a mark measurement can not be performed with high precision. To solve this, by selectively removing the interlayer insulating film 107A and the stopper insulating film 106 formed over the mark structure 100, a structure of FIG. 11 is achieved. The level difference of the mark structure 100 is left as the level difference in projection and depression of the bit line layer 113 and therefore the mark structure can be reliably measured.

In FIGS. 10 and 11, elements identical to those of FIG. 2 are given the same reference signs and duplicated discussion is omitted.

Further, though the bit line layer 113 is formed of the a polycide consisting of the doped polysilicon 1131 and the tungsten silicide layer 1132 in the first preferred embodiment, a titanium silicide (TiSi) layer, a cobalt silicide (CoSi) layer, a tantalum silicide (TaSi) layer or a molybdenum silicide (MoSi) layer may be used instead of the tungsten silicide layer.

Instead of polycide, a metal film such as Al (aluminum), AlCu (aluminum copper), AlSiCu (aluminum silicon copper), W (tungsten), Co (cobalt), Ti (Titanium), Cu (copper), Pt (platinum) or Ru (ruthenium) may be used.

A high-dielectric material such as TiN (titanium nitride), TaO (tantalum oxide), $RuO_2$ (ruthenium oxide), BST (barium strontium titanate; $BaSrTiO_3$), $SrTiO_3$ or PZT (lead zirconate titanate; $Pb(Zr, Ti)O_3$) may be used.

Though the thickness of the stopper insulating film 106 is 50 nm in the first preferred embodiment, the thickness may be about 100 to 300 nm. Further, whether the film is opaque or translucent depends on a wavelength, a material of the interlayer insulating film (refractive index, absorption coefficient) and a film thickness to be measured.

B. The Second Preferred Embodiment

<B-1. Device Structure>

Referring to FIGS. 12 and 13, a structure of a mark of a semiconductor device in accordance with the second preferred embodiment will be discussed. FIG. 12 is a plan view of a position check mark MK12. As shown in FIG. 12, the position check mark MK12 consists of a plurality of elongated mark structures 200 having a predetermined length arranged in parallel at intervals in a rectangular opening 308.

FIG. 13 is a cross sectional view taken along the line B—B of FIG. 12. As shown in FIG. 13, the mark structure 200 is formed on the silicon substrate 101 inside the opening 308 formed by selectively removing the stopper insulating film 106 and the interlayer insulating film 107 formed on the silicon substrate 101.

The mark structure 200 consists of the gate oxide film 102 formed on the silicon substrate 101, the gate wiring layer 103 (a first wiring layer) formed on the gate oxide film 102 and the sidewall 305 formed in contact with the side surfaces of the gate wiring layer 103 and the gate oxide film 102.

Elements of the position check mark MK12 identical to those of the position check mark MK11 of FIG. 2 are given the same reference signs and redundant discussion ill be omitted.

The sidewall 305 is made of a silicon nitride film having a thickness of, e.g., 50 nm, and protrudes from an upper main surface of the gate wiring layer 103 for a manufacturing reason.

The opaque bit line layer 113 (a second wiring layer) is formed, extending from on the interlayer insulating film 107 to on the mark structure 200, as a polycide of the doped polysilicon layer 1131 having a thickness of, e.g., 100 nm and the tungsten silicide (WSi) 1132 having a thickness of 100 nm.

FIG. 12 does not faithfully show a view of the structure of FIG. 13 from above, omitting the bit line layer 113 inside the opening 308, for easy understanding of the opening 308 and the arrangement of the mark structures 200. Further, since the sidewall 305 is transparent, viewed as the mark structure 200 is the tungsten silicide layer 1032 of the gate wiring layer 103.

<B-2. Function and Effect>

Since the bit line layer 113 is formed along an outline of the mark structure 200, covering the upper portion of the interlayer insulating film 107, the side surface of the interlayer insulating film 107 defining the opening 308 and the silicon substrate 101 at the bottom of the opening 308, the level difference of the mark structure 200 is left as the level difference in projection and depression of the bit line layer 113 and the mark structure 200 can be measured indirectly through the bit line layer 113.

Therefore, when, for example, the bit line layer 113 is patterned to form a predetermined bit-line pattern, an alignment of the mask pattern of a stepper is made by using the position check mark MK12 consisting of mark structures 200 and after the bit-line pattern is formed, the position check mark MK12 is used to check if the pattern is overlaid on a proper position, and at this time, regardless of whether the bit line layer 113 is opaque or not, the level difference of the mark structure 200 can be reliably measured, to prevent defectiveness such as misalignment due to unmeasured mark.

The translucent stopper insulating film 106 serving as an etching stopper in formation of the contact hole penetrating the interlayer insulating film 107 to reach the semiconductor substrate 101 in a self-align manner in the element formation region is not formed on the mark structures 200. Therefore, since the intensity of the visible light used for the measurement is not lowered due to the existence of the stopper insulating film 106 to prevent deterioration in contrast of the position check mark MK12 and no change in contrast is caused by variation in thickness of the stopper insulating film 106, a measurement of mark can be performed with high precision.

<B-3. Manufacturing Method>

A method of manufacturing a semiconductor device having the position check mark MK12 discussed with reference to FIGS. 12 and 13 will be discussed now, with reference to FIGS. 14 to 16 showing the process step by step.

First, a silicon oxide film serving as the gate oxide film 102 of FIG. 14 is formed on the silicon oxide film 101 to have a thickness of 10 nm, and a polycide layer serving as the gate wiring layer 103 is formed by layering a doped polysilicon layer having a thickness of, e.g., 100 nm and a tungsten silicide layer having a thickness of 100 nm. A TEOS oxide film serving as the insulating film 104 is formed on the polycide layer to have a thickness of, e.g., 200 nm, and a resist mask formed over the TEOS oxide film is selectively etched to form the insulating film 104. After that, using the insulating film 104 as a mask, the lower layers are selectively etched.

Next, a stopper insulating film 306 is entirely formed of a silicon nitride film to have a thickness, e.g., 50 nm. As shown in FIG. 14, a resist 410 is formed on the stopper insulating film 306 and patterned so that a portion for formation of the position check mark MK12 may be an opening.

In the element formation region (see FIG. 42), as discussed referring to FIG. 6, the gate structure GT is formed in a step corresponding to that of FIG. 14 and the stopper insulating film 306 is so formed as to cover the gate structure GT. In the step corresponding to that of FIG. 14, the interlayer insulating film 107 shown in FIG. 6 is not yet formed.

In FIG. 14, the sidewall 105 of FIG. 6 is not formed, because in a step of forming a TEOS oxide film serving as the sidewall 105, the mark portion is covered with the mask to avoid formation of the oxide film.

Subsequently, in a step of FIG. 15, the stopper insulating film 306 is selectively removed by dry etching and the like using the resist 410 so that the stopper insulating film 306 may be left on the side surfaces of the insulating film 104, the gate wiring layer 103 and the gate oxide film 102, serving as the sidewall 305.

At this time, in the element formation region, the stopper insulating film 306 is covered with the resist 410, not to be removed.

Next, after removing the resist 410, a TEOS oxide film having a thickness of, e.g., 600 nm is formed on the stopper insulating film 306 and polished by CMP into a thickness of about 100 nm, to achieve the interlayer insulating film 107 of FIG. 16. After that, a resist 420 is patterned so that the interlayer insulating film 107 in a portion for formation of the mark structures 200 may be removed, and the interlayer insulating film 107 is selectively removed by dry etching and the like, with the resist 420 as a mask, to form the opening 308.

Since the insulating film 104 is made of the TEOS oxide film like the interlayer insulating film 107 though the sidewall 305 is made of a nitride film so as not to be removed by etching for the interlayer insulating film 107, the insulating film 104 is removed together with the interlayer insulating film 107 as shown in FIG. 16.

At this time, in the element formation region, as discussed referring to FIG. 7, the interlayer insulating film 107 is selectively removed to form the contact hole CH1.

Subsequently, in the element formation region, as discussed referring to FIG. 8, in a step of removing the stopper insulating film 306 left in the contact hole CH1 to expose the gate structure GT, the sidewall 305 inside the opening 308 is slightly removed.

Finally, the doped polysilicon layer 1131 having a thickness of, e.g., 100 nm and the tungsten silicide layer 1132 having a thickness of 100 nm are layered in this order to form the bit line layer 113, extending from on the interlayer insulating film 107 to on the mark structures 200. Thus, the position check mark MK12 of FIG. 13 is achieved.

At this time, in the element formation region, as discussed referring to FIG. 9, the doped polysilicon 1131 and the tungsten silicide layer 1132 are layered in this order to form the bit line layer 113, extending from on the interlayer insulating film 107 to on the mark structures 200. Thus, by forming the bit line layer 113, the bit line layer 113 is connected to the silicon layer 101, to complete the MOS transistor.

<B-4. Variation>

Also in the above second preferred embodiment, the same variations as in the first preferred embodiment are possible. The opening 308 may be formed by using a mask dedicated to the mark. The planarization of the interlayer insulating film 107 may be performed by using methods other than CMP. The present invention can be effective on a not-planarized interlayer insulating film.

Further, the bit line layer 113 is not limited to the tungsten silicide layer or polycide, but may be made of metal film or high-dielectric material.

C. The Third Preferred Embodiment

<C-1. Device Structure>

Referring to FIGS. 17 and 18, a structure of a mark of a semiconductor device in accordance with the third preferred embodiment will be discussed. FIG. 17 is a plan view of a position check mark MK13. As shown in FIG. 17, the position check mark MK13 consists of a plurality of elongated mark structures 300 having a predetermined length arranged in parallel at intervals in a rectangular opening 508.

FIG. 18 is a cross sectional view taken along the line C—C of FIG. 17. As shown in FIG. 18, the mark structure 300 is formed on the silicon substrate 101 inside the opening 508 formed by selectively removing the interlayer insulating film 507 (a first interlayer insulating film) formed on the silicon substrate 101.

The mark structure 300 consists of the gate oxide film 102 formed on the silicon substrate 101, the gate wiring layer 103 (a first wiring layer) formed on the gate oxide film 102 and the sidewall 505 formed in contact with the side surfaces of the gate wiring layer 103 and the gate oxide film 102.

Elements of the position check mark MK13 identical to those of the position check mark MK11 of FIG. 2 are given the same reference signs and redundant discussion will be omitted.

The sidewall 505 is made of a silicon nitride film having a thickness of, e.g., 50 nm, and the interlayer insulating film 507 is made of a TEOS oxide film having a thickness of, e.g., 500 nm and its outermost surface is planarized by CMP.

A translucent insulating film 516 is formed of a silicon nitride film, having a thickness of 50 nm, extending from on the interlayer insulating film 507 to on a side surface of the opening 508.

Further, an interlayer insulating film 517 (a second interlayer insulating film) is formed, entirely covering those elements. The interlayer insulating film 517 is made of a transparent BPTEOS oxide film, having a thickness of, e.g., 300 nm.

A translucent conductive film 523 (a second wiring layer) is formed on the interlayer insulating film 517. The conductive film 523 is made of a doped polysilicon having a thickness of, e.g., 100 nm.

FIG. 17 does not faithfully show a view of the structure of FIG. 18 from above, omitting the conductive film 523 on the opening 508, for easy understanding of the opening 508 and the arrangement of the mark structures 300. Further, since the sidewall 505 is transparent, viewed as the mark structure 300 is the tungsten silicide layers 1032 of the gate wiring layer 103.

Herein, structures of a MOS transistor and a stacked capacitor SC1 formed thereon in the element formation region (see FIG. 42) will be discussed, referring to FIG. 19.

As shown in FIG. 19, a storage node contact SNC penetrating the interlayer insulating film 507 covering the gate structure GT to reach a source/drain region formed in the silicon substrate 101 is formed in the element formation region. The storage node contact SNC is connected to a storage node SN1 formed on the interlayer insulating film 507. The storage node SN1 is a cylinder whose inside is hollow and the insulating film 516 and the interlayer insulating film 517 make an insulation between adjacent storage nodes. The conductive film 523 is so formed as to cover the storage node SN1 and the interlayer insulating film 517, which serves as a counter electrode to the storage node SN1, termed cell plate.

The structure of the gate structure GT is the same as the structure of the mark structure 100 of the position check mark MK11 as discussed with reference to FIG. 2, and no discussion will be made thereon. Further, not shown in FIG. 2, a bit line is also formed inside the interlayer insulating film 507.

<C-2. Function and Effect>

As discussed above, in the position check mark MK13, since no interlayer insulating film 507 exists on the mark structures 300 formed of the gate wiring layer 103 and the mark structures 300 are covered with the interlayer insulating film 517 which is an upper film and originally not in contact therewith, the level difference of the mark structure 300 is left as the level difference in projection and depression of the interlayer insulating film 517 and further as the level difference in projection and depression of the conductive film 523, and the mark structure 300 can be measured indirectly through the conductive film 523.

Therefore, when, for example, the conductive film 523 is patterned to form a cell plate shown in FIG. 19, an alignment of the mask pattern of a stepper is made by using the position check mark MK13 consisting of mark structures 300 and after the bit-line pattern is formed, the position check mark MK13 is used to check if the pattern is overlaid on a proper position, and at this time, regardless of whether the conductive film 523 is translucent or not, the level difference of the mark structure 300 can be reliably measured, to prevent defectiveness such as misalignment due to unmeasured mark.

Even if translucent, the insulating film 516 does not exist on the mark structures 300. Therefore, since the intensity of the visible light used for the measurement is not lowered and the level difference of the mark structure 300 can be clearly measured to prevent deterioration in contrast of the position check mark MK13 and no change in contrast is caused by variation in thickness of the insulating film 516, a measurement of mark can be performed with high precision.

<C-3. Manufacturing Method>

A method of manufacturing a semiconductor device having the position check mark MK13 discussed with reference to FIGS. 17 and 18 will be discussed now, with reference to FIGS. 20 to 23 showing the process step by step.

First, a silicon oxide film serving as the gate oxide film 102 of FIG. 20 is formed on the silicon oxide film 101 to have a thickness of 10 nm, and a polycide layer serving as the gate wiring layer 103 is formed by layering a doped polysilicon layer having a thickness of, e.g., 100 nm and a tungsten silicide layer having a thickness of 100 nm. A TEOS oxide film serving as the insulating film 104 is formed on the polycide layer to have a thickness of, e.g., 200 nm, and a resist mask formed over the TEOS oxide film is selectively etched to form the insulating film 104. After that, using the insulating film 104 as a mask, the lower layers are selectively etched. Subsequently, a TEOS oxide film is formed entirely to have a thickness of, e.g., 50 nm and the TEOS oxide film is so selectively etched as to be left only on side surfaces of the insulating film 104, the gate wiring layer 103 and the gate oxide film 102, to form a sidewall 105.

Next, a TEOS oxide film having a thickness of, e.g., 600 nm is entirely formed and polished by CMP into a thickness of about 100 nm, to achieve the interlayer insulating film 507.

Subsequently, in a step of FIG. 21, a resist 610 is patterned on the interlayer insulating film 507 so that the interlayer insulating film 507 in a portion for formation of the mark may be removed and the interlayer insulating film 507 is selectively removed by dry etching and the like using the resist 610 to form the opening 508. At this time, formed of the TEOS oxide film like the interlayer insulating film 507, both the insulating film 104 and the sidewall 105 are removed.

In the element formation region, at this time, a contact hole to be filled with the storage node contact SNC of FIG. 19 is formed.

Next, in a step of FIG. 22, the insulating film 516 is entirely formed of a silicon nitride film having a thickness of, e.g., 50 nm and a resist 620 is patterned thereon.

In the element formation region, at this time, the insulating film 516 is used as a stopper film in formation of the stacked capacitor SC of FIG. 19.

Subsequently, in a step of FIG. 23, the insulating film 516 is etched with the resist 620 as a mask, being left in contact with the side surfaces of the gate wiring layer 103 and the gate oxide film 102, to form the sidewall 505. At this time, the insulating film 516 is left on a main surface of the interlayer insulating film 507 covered with the resist 620 and on a side surface of the interlayer insulating film 507.

Next, after forming the BPTEOS oxide film to have a thickness of, e.g., 300 nm, the film is annealed at about 800° C., to entirely form the interlayer insulating film 517.

In the element formation region, at this time, the interlayer insulating film 517 is formed between the storage nodes SN1 shown in FIG. 19.

Subsequently, on the interlayer insulating film 517, a doped polysilicon having a thickness of, e.g., 100 nm is formed to form the conductive film 523.

In the element formation region, at this time, the conductive film 523 is formed as the counter electrode to the storage node SN1 of FIG. 19, to complete the MOS transistor and the stacked capacitor.

The position check mark MK13 consisting of mark structures 300 is used for an alignment of the mask pattern when the conductive film 523 is patterned in the element formation region and after the cell plate is formed, the mark MK13 is used to check if the pattern is overlaid on a proper position. At this time, regardless of whether the conductive film 523 is translucent or not, the level difference of the mark structure 300 can be reliably measured, to prevent defectiveness such as misalignment due to unmeasured mark.

Even if translucent, the insulating film 516 does not exist on the mark structures 300. Therefore, since the intensity of the visible light used for the measurement is not lowered and the level difference of the mark structure 300 can be clearly measured to prevent deterioration in contrast of the position check mark MK13 and no change in contrast is caused by variation in thickness of the insulating film 516, a measurement of mark can be performed with high precision.

<C-4. Variation>

Also in the above third preferred embodiment, the same variations as in the first preferred embodiment are possible. The opening 508 may be formed by using a mask dedicated to the mark. The planarization of the interlayer insulating film 507 may be performed by using methods other than CMP. The present invention can be effective on a not-planarized interlayer insulating film.

Further, though the above discussion is made on a case where the conductive film 523 is formed of the doped polysilicon, an opaque film of polycide such as the tungsten silicide (WSi), a titanium silicide (TiSi), a cobalt silicide (CoSi) layer, a tantalum silicide (TaSi) layer or a molybdenum silicide (MoSi) may be used. Furthermore, the conductive film 523 is not limited to the polycide but may be made of metal film or high-dielectric material.

D. The Fourth Preferred Embodiment

<D-1. Device Structure>

Referring to FIGS. 24 and 25, a structure of a mark of a semiconductor device in accordance with the fourth preferred embodiment will be discussed. FIG. 24 is a plan view of a position check mark MK14. As shown in FIG. 24, the position check mark MK14 consists of a plurality of hole arrays HL made of a plurality of mark holes 718 aligned in one direction arranged in parallel at intervals.

FIG. 25 is a cross sectional view taken along the line D—D of FIG. 24. As shown in FIG. 25, the position check mark MK14 consists of a plurality of the mark holes 718 formed penetrating an interlayer insulating film 717 formed on the silicon substrate 101, a doped polysilicon layer 733 (a second conductive film) buried into the mark holes 718 and formed in regions on the interlayer insulating film 717 in a rectangular opening 728 defined by the an insulating film 726, an oxide film 734 formed on the doped polysilicon layer 733 and a sidewall (a second sidewall) formed on a side wall of the oxide film 734.

The contact holes 718 are arranged at a pitch of 0.6 μm in Y direction and a pitch of 8 μm in X direction of FIG. 24 and each have an opening size of about 0.3 μm.

The interlayer insulating film 717 is formed of a TEOS oxide film having a thickness of, e.g., 500 nm and its outermost surface is planarized by CMP. The insulating film 726 is a silicon nitride film having a thickness of, e.g., 50 nm, and the doped polysilicon layer 733 has a thickness of about 150 nm. The oxide film 734 is formed of a BPTEOS oxide film having a thickness of about 600 nm, and the sidewall 735 is formed of a doped polysilicon having a thickness of about 50 nm.

Herein, a structure of the stacked capacitor SC in the element formation region (see FIG. 42) will be discussed with reference to FIG. 26. As shown in FIG. 26, the stacked capacitor SC consists of a contact holes 708 selectively so formed as to penetrate the interlayer insulating film 717 and the insulating film 726 formed on the silicon substrate 101, the doped polysilicon layer 733 (referred to as bottom storage node 733 (a first conductive film) in the stacked capacitor) so formed as to fill the contact holes 708, the oxide film 734 (referred to as storage node core 734 in the stacked capacitor) formed on the bottom storage node 733 and the sidewall 735 (a first sidewall) so formed as to surround the storage node core 734.

Thus, the doped polysilicon layer 733 and the oxide film 734 constituting the position check mark MK14 correspond to the bottom storage node 733 and the storage node core 734 in the stacked capacitor SC and are formed through the same steps, respectively. Though the mark hole 718 in the position check mark MK14 is formed through the same step as the contact hole 708 in the stacked capacitor SC, the mark hole 718 has a slightly-larger opening size as compared with the contact hole 708 having an opening size of, e.g., about 0.2 μm, for reliable measurement.

<D-2. Function and Effect>

As discussed above, the position check mark MK14, consisting of the mark holes 718 whose opening size is almost the same as that of the storage node contact hole 708, is suitable for alignment of hole-shaped patterns which are needed in forming a stacked capacitor in the element formation region.

Specifically, the position check mark MK14 is a hole-shaped mark, which can reduce an influence of coma aberration as compared with a line-shaped mark in alignment of hole-shaped patterns, to reduce misalignment.

Further, since the position check mark MK14 consists of the mark holes 718 whose opening size is almost the same as that of the storage node contact hole 708 (see FIG. 26), through the process of forming the stacked capacitor SC (see FIG. 26), a structure like the stacked capacitor SC can be formed on the mark hole 718.

Specifically, the doped polysilicon layer 733 (i.e., bottom storage node) surrounds the sidewall 735 and the oxide film 734 (i.e., storage node core) is formed in a region defined by the doped polysilicon layer 733 and the sidewall 735.

Therefore, the doped polysilicon layer 733 and the sidewall 735 are united and even when the oxide film 734 is removed by using hydrofluoric acid and the like, there arises no phenomenon where the sidewall 735 is removed, floating in an etchant solution (in this case, hydrofluoric acid), and it is possible to prevent short circuit of the semiconductor element by the sidewall 735, which leads to defectiveness and deterioration in manufacturing process yield.

<D-3. Manufacturing Method>

A method of manufacturing a semiconductor device having the position check mark MK14 discussed with reference to FIGS. 24 and 25 will be discussed now, with reference to FIGS. 27 to 30 showing the process step by step.

First, in a step of FIG. 27, a TEOS oxide film is formed on the silicon substrate 101 to have a thickness of, e.g., 60 nm and polished by CMP into about 100 nm, to form the interlayer insulating film 717.

Next, a nitride film having a thickness of, e.g., 50 nm, is formed on the interlayer insulating film 717, to form the insulating film 726, and a resist 820 is patterned thereon. This pattern is used to open an upper portion of the mark holes 718. Subsequently, the insulating film 726 is etched with the resist 820 as a mask, to form an opening 728.

At this time, the insulating film 726 of the stacked capacitor SC (see FIG. 26) in the element formation region is patterned concurrently.

Next, in a step of FIG. 28, a plurality of mark holes 718 each having an opening size (diameter) of 0.3 μm are so arranged as to penetrate the interlayer insulating film 717 at a pitch of 0.6 μm in Y direction and a pitch of 8 μm in X direction.

At this time, the storage node contact holes 708 are formed of the stacked capacitor SC in the element formation region.

Subsequently, the doped polysilicon layer 733 having a thickness of, e.g., 150 nm is entirely formed to fill the mark holes 718. Further, the doped polysilicon layer 733 has a thickness of half of the opening of the mark hole 718 or larger to reliably fill the mark holes 718.

At this time, the storage node contact hole 708 of the stacked capacitor SC in the element formation region is filled with the bottom storage node 733.

Next, in a step of FIG. 29, a BPTEOS oxide film having a thickness of, e.g., 600 nm is deposited to entirely form the oxide film 734. Subsequently, a resist 830 is formed and patterned on the oxide film 734. This pattern is used to leave the resist 830 on the upper portion of the mark holes 718 in the opening 728.

At this time, the pattern of the resist 830 is formed on the bottom storage node 733 of the stacked capacitor SC in the element formation region.

In patterning of the resist 830, alignment of the mask pattern of the stepper is performed with arrangement of mark holes 718, i.e., the position check mark MK14, and after patterning of the resist 830, the position check mark MK14 is used to check if the pattern is overlaid on a proper position.

Next, in a step of FIG. 30, the oxide film 734 and the doped polysilicon layer 733 are etched with the resist 830 as a mask.

At this time, the bottom storage node 733 and the storage node core 734 of the stacked capacitor SC are patterned in a cylinder shape in the element formation region.

Subsequently, a doped polysilicon having a thickness of, e.g., 50 nm is entirely formed and anisotropically etched back, to form the sidewall 735 extending from on the side wall of the oxide film 734 to on the doped polysilicon layer 733.

At this time, the cylinder-shaped sidewall 735 of the stacked capacitor SC is formed in the element formation region.

Since the storage node core 734 is not needed and removed by hydrofluoric acid and the like in the stacked capacitor SC of FIG. 26, the oxide film 734 is removed also in the mark portion. At this time, the insulating film 726 which is a nitride film serves as an etching stopper.

After that, in the stacked capacitor SC, though a dielectric film is formed along outlines of the bottom storage node 733 and the sidewall 735 and a counter electrode, referred to as cell plate, to the bottom storage node 733 is formed along an outline of the dielectric film, to complete the storage node, arrangement of the mark holes 718, i.e., the position check mark MK14 is used to check alignment and overlay of the mask pattern of the stepper when the dielectric film and the cell plate are patterned.

<D-4. Variation>

Though the above discussion of the fourth preferred embodiment is made on a case where the mark hole 718 is filled with the doped polysilicon 733, the mark hole 718 may be filled with a doped amorphous silicon or a non-doped amorphous silicon, or a metal film such as Ti (Titanium), TiN (titanium nitride), TaN (tantalum nitride), W (tungsten), Al (aluminum), AlCu (aluminum copper) or Cu (copper).

Further, the above discussion is made on a case where the oxide film (storage node core) 734 is formed of a BPTEOS film, the oxide film 734 may be formed of PTEOS (phospho TEOS), BPSG (Boro-Phospho Silicate Glass), PSG (phospho-silicate glass) or SOG (Spin On Glass), depending on a selection ratio to the insulating film 726.

Furthermore, the oxide film (storage node core) 734 may be removed by using vapor hydrofluoric acid or by dry etching.

The above discussion is made on a case where the sidewall 735 is formed of doped polysilicon, the sidewall 735 may be formed of doped amorphous or ion-implanted non-doped amorphous. Further, the sidewall 735 may be roughened to widen its surface area.

E. The Fifth Preferred Embodiment

<E-1. Device Structure>

Referring to FIGS. 31 and 32, a structure of a mark of a semiconductor device in accordance with the fifth preferred embodiment will be discussed. FIG. 31 is a plan view of a position check mark MK15. As shown in FIG. 31, the position check mark MK15 consists of a plurality of hole arrays HL made of a plurality of mark holes 918 aligned in one direction arranged in parallel at intervals.

FIG. 32 is a cross sectional view taken along the line E—E of FIG. 31. As shown in FIG. 32, the position check mark MK15 consists of a plurality of the mark holes 918 so formed as to penetrate an interlayer insulating film 917 formed on the silicon substrate 101, a recess plug 928 buried into the mark holes 918, an opaque barrier metal 919 entirely formed on a main surface of the interlayer insulating film 917 and an opaque conductive film 923 formed on the barrier metal 919.

The mark holes 918 are arranged at a pitch of 0.6 μm in Y direction and a pitch of 8 μm in X direction of FIG. 31 and each have an opening size (diameter) of about 0.3 μm. Further, the mark hole 918 has an opening size as large as or slightly larger than the storage node contact hole of the storage node in the element formation region (see FIG. 42).

FIG. 31 does not faithfully show a view of the structure of FIG. 32 from above, omitting the barrier metal 919 and the conductive film 923, for easy understanding of the arrangement of the mark holes 918.

The interlayer insulating film 917 is formed of a TEOS oxide film having a thickness of, e.g., 500 nm and its outermost surface is planarized by CMP.

The recess plug 928 is formed of a doped polysilicon and buried into the mark holes 918 so that its one end surface may be recessed by about 50 nm from the main surface of the interlayer insulating film 917.

The barrier metal 919 is an opaque film made of a layered film consisting of Ti (titanium) having a thickness of, e.g., 50 nm and TiN (titanium nitride) having a thickness of 100 nm. The conductive film 923 is an opaque film made of Pt (platinum) having a thickness of, e.g., 50 nm.

Further, in the element formation region (see FIG. 42), the storage node contact hole is also filled with the doped polysilicon to form a plug which is not recessed. The conductive film 923 serves as a storage node and a cell plate is formed as a counter electrode in an upper portion of the storage node, to complete a stacked capacitor.

<E-2. Function and Effect>

As discussed above, since the recess plug 928 is buried into the mark holes 918 to provide a recess portion and the barrier metal 919 is buried into the recess portion to make a surface of the barrier metal 919 corresponding to the positions of the mark holes 918 depressed and further make the conductive film 923 depressed in the position check mark MK15, the position check mark MK15 consisting of the mark holes 918 can be measured with high precision.

Further, constituted of the arranged mark holes 918 whose opening size is almost the same as that of the storage node contact hole of the storage node in the element formation region (see FIG. 42), the position check mark MK15 is suitable for alignment of hole-shaped patterns which are needed in forming a storage node in the element formation region.

Specifically, the position check mark MK15 is a hole-shaped mark, which can reduce an influence of coma aberration as compared with a line-shaped mark in alignment of hole-shaped patterns, to reduce misalignment.

<E-3. Manufacturing Method>

Figure 33:
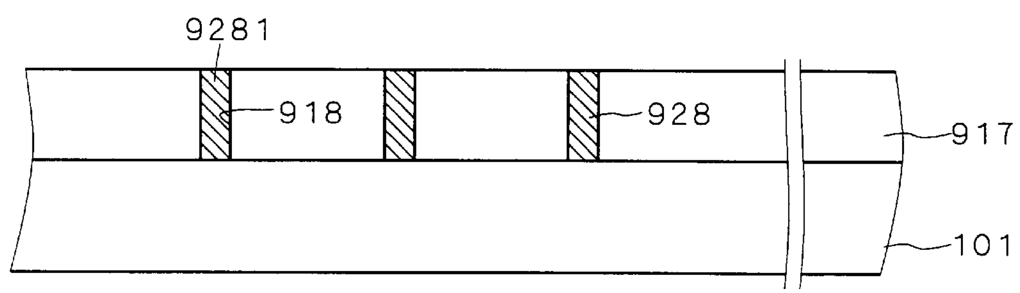
Figure 34:
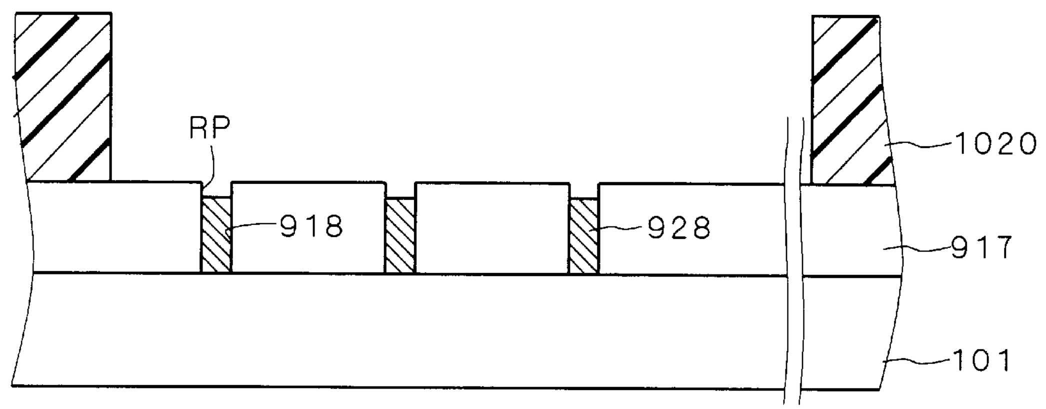
Figure 46:
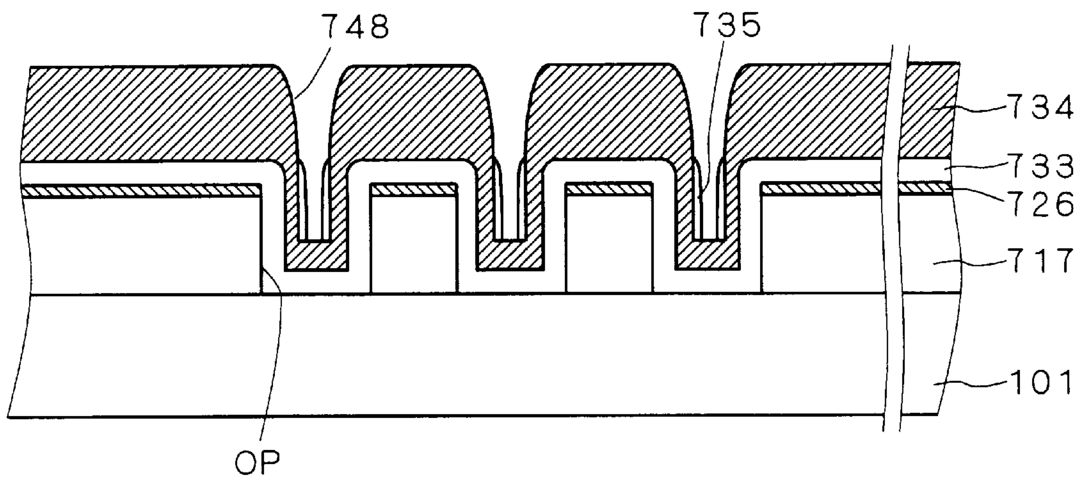
FIG. 46 is a cross section showing a mark in the background art.
Figure 47:
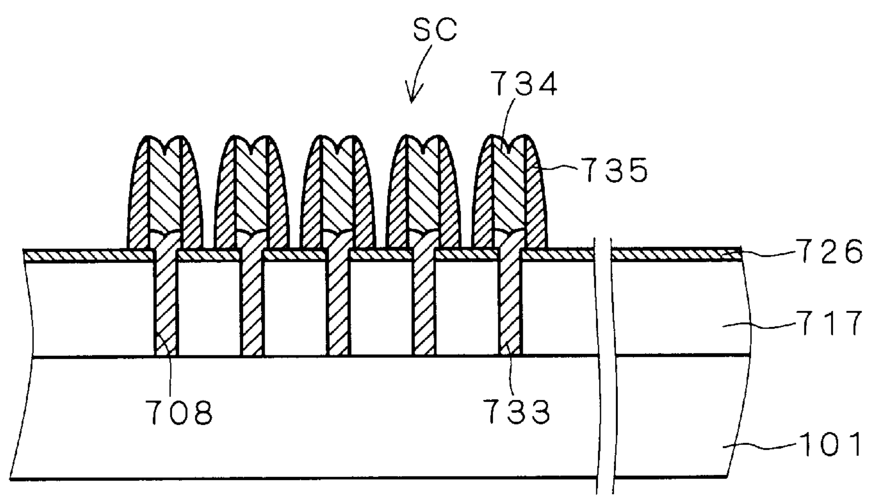
FIG. 47 is a cross section showing a structure of a stacked capacitor.

A method of manufacturing a semiconductor device having the position check mark MK15 discussed with reference to FIGS. 31 and 32 will be discussed now, with reference to FIGS. 33 to 35 showing the process step by step.

First, in a step of FIG. 33, a TEOS oxide film is formed on the silicon substrate 101 to have a thickness of, e.g., 60 nm and polished by CMP into about 100 nm, to form the interlayer insulating film 917.

Next, a not-shown resist is patterned and a plurality of mark holes 918 each having an opening size (diameter) of 0.3 μm are so formed by using the resist as a mask as to penetrate the interlayer insulating film 917 at a pitch of 0.6 μm in Y direction and a pitch of 8 μm in X direction of FIG. 31.

The opening size (diameter) of the mark hole 918 ranges from as large as to almost twice that of the storage node contact hole in the element formation region.

Subsequently, a doped polysilicon having a thickness of, e.g., 200 nm is entirely formed on the interlayer insulating film 917 and polished by CMP into about 200 nm, to bury a plug 9281 into the mark holes 918. An end surface of the plug 9281 on a side opposite to the silicon substrate 101 is almost coplanar with the main surface of the interlayer insulating g film 917.

Next, in a step of FIG. 34, a resist 1020 is formed and patterned on the interlayer insulating film 917. This pattern is used to open an upper portion of the mark holes 918. Subsequently, the plug 9281 is etched with the resist 1020 as a mask, to form the recess plug 928 whose end surface on the side opposite to the silicon substrate 101 is recessed by about 50 nm from the main surface of the interlayer insulating film 917. A recess portion RP is thereby formed on an upper portion of the recess plug 928.

This etching is a dry etching using halogen-based gas such as chlorine.

Further, since it is desirable that the storage node contact hole should be filled with the plug 9281 in the element formation region, a pattern with the resist 1020 is used on the storage node contact hole so as not to be etched as above.

Next, in a step of FIG. 35, the barrier metal 919 is formed of a layered film consisting of Ti (titanium) having a thickness of, e.g., 50 nm and TiN (titanium nitride) having a thickness of 100 nm.

At this time, a depression DP is caused by the level difference of the recess portion RP in a surface of the barrier metal 919 corresponding to the position of the mark hole 918.

After this, the conductive film 923 is formed of Pt (platinum) having a thickness of, e.g., 50 nm on the barrier metal 919, and the conductive film 923 also becomes depressed because of the depression DP of the barrier metal 919.

Further, in patterning of the barrier metal 919, the depression in the surface of the barrier metal 919 corresponding to the position of the mark hole 918 as the position check mark MK15 is used to check alignment and overlay of the mask pattern of the stepper.

Further, in patterning of the conductive film 923, the depression in the surface of the conductive film 923 corresponding to the position of the mark hole 918 as the position check mark MK15 is used to check alignment and overlay of the mask pattern of the stepper.

<E-4. Variation>

Though the above discussion of the fifth preferred embodiment is made on a case where the mark hole 918 is filled with the doped polysilicon, the mark hole 918 may be filled with a doped amorphous silicon or a non-doped amorphous silicon, or a metal film such as Ti (Titanium), TiN (titanium nitride), TaN (tantalum nitride), W (tungsten), Al (aluminum), AlCu (aluminum copper) or Cu (copper).

Further, the above discussion is made on a case where the conductive film 923 is of platinum, the conductive film 923 has only to be an opaque conductive film and may be Ru (ruthenium), $RuO_2$ (ruthenium oxide), W (tungsten), Al (aluminum), AlCu (aluminum copper) or Cu (copper).

F. The Sixth Preferred Embodiment

<F-1. Device Structure>

Referring to FIGS. 36 and 37, a structure of a mark of a semiconductor device in accordance with the sixth preferred embodiment will be discussed. FIG. 36 is a plan view of a position check mark MK16. As shown in FIG. 36, the position check mark MK16 consists of a plurality of hole arrays HL made of a plurality of mark holes 1118 aligned in one direction arranged in parallel at intervals.

FIG. 37 is a cross sectional view taken along the line F≠F of FIG. 36. As shown in FIG. 37, the position check mark MK16 consists of a plurality of the mark holes 1118 so formed as to penetrate an interlayer insulating film 1117 formed on the silicon substrate 101, a plug 1128 (protrusion plug) so buried into the mark holes 1118 as to protrude therefrom, an opaque barrier metal 1119 entirely formed on a main surface of the interlayer insulating film 1117 and an opaque conductive film 1123 formed on the barrier metal 1119.

The mark holes 1118 are arranged at a pitch of 0.6 μm in Y direction and a pitch of 8 μm in X direction of FIG. 36 and each have an opening size (diameter) of about 0.3 μm. Further, the mark hole 1118 has an opening size as large as or slightly larger than the storage node contact hole of the storage node in the element formation region (see FIG. 42).

FIG. 36 does not faithfully show a view of the structure of FIG. 37 from above, omitting the barrier metal 1119 and the conductive film 1123, for easy understanding of the arrangement of the mark holes 1118.

The interlayer insulating film 1117 is formed of a TEOS oxide film having a thickness of, e.g., 500 nm and its outermost surface is planarized by CMP.

The main surface of the interlayer insulating film 1117 has a recess region RR where the whole region in which the mark holes 1118 are formed is recessed at a depth of about 50 nm. The plug 1128 is formed of a doped polysilicon and buried into the mark holes 1118 so that its one end surface may protrude by about 50 nm from a surface of the recess region RR in the interlayer insulating film 1117.

The barrier metal 1119 is an opaque film made of a layered film consisting of Ti (titanium) having a thickness of, e.g., 50 nm and TiN (titanium nitride) having a thickness of 100 nm. The conductive film 1123 is an opaque film made of Pt (platinum) having a thickness of, e.g., 50 nm.

Since the barrier metal 1119 is formed on the protruding plug 1128, a portion thereof corresponding to the plug 1118 is projected. Similarly, a portion of the conductive film 1123 corresponding to the protrusion of the plug 1118 is projected.

Further, in the element formation region (see FIG. 42), though the storage node contact hole is also filled with the doped polysilicon to form a plug which is the same as the plug 1128, the interlayer insulating film 1117 is not recessed and a tip portion of the plug does not protrude. The conductive film 1123 serves as a storage node and a cell plate is formed as a counter electrode in an upper portion of the storage node, to complete a stacked capacitor.

<F-2. Function and Effect>

As discussed above, since the recess region RR is provided so that the plug 1128 may protrude from the mark holes 1118 and the barrier metal 1119 and the conductive film 1123 are formed on the protruding plug 1128 to project the surfaces of the barrier metal 1119 and the conductive film 1123 corresponding to the position of the plug 1128, the position check mark MK16 consisting of the mark holes 1118 can be measured with high precision even when the barrier metal 1119 and the conductive film 1123 are opaque.

Further, constituted of the arranged mark holes 1118 whose opening size is almost the same as that of the storage node contact hole of the storage node in the element formation region (see FIG. 42), the position check mark MK16 is suitable for alignment of hole-shaped patterns which are needed in forming a storage node in the element formation region.

Specifically, the position check mark MK16 is a hole-shaped mark, which can reduce an influence of coma aberration as compared with a line-shaped mark in alignment of hole-shaped patterns, to reduce misalignment.

<F-3. Manufacturing Method>

A method of manufacturing a semiconductor device having the position check mark MK16 discussed with reference to FIGS. 36 and 37 will be discussed now, with reference to FIGS. 38 to 40 showing the process step by step.

First, in a step of FIG. 38, a TEOS oxide film is formed on the silicon substrate 101 to have a thickness of, e.g., 60 nm and polished by CMP into about 100 nm, to form the interlayer insulating film 1117.

Next, a not-shown resist is patterned and a plurality of mark holes 1118 each having an opening size (diameter) of 0.3 μm are so formed by using the resist as a mask as to penetrate the interlayer insulating film 1117 at a pitch of 0.6 μm in Y direction and a pitch of 8 μm in X direction of FIG. 36.

The opening size (diameter) of the mark hole 1118 ranges from as large as to almost twice that of the storage node contact hole in the element formation region.

Subsequently, a doped polysilicon having a thickness of, e.g., 200 nm is entirely formed on the interlayer insulating film 1117 and polished by CMP into about 200 nm, to bury a plug 1128 into the mark holes 1118. An end surface of the plug 1128 on a side opposite to the silicon substrate 101 is almost coplanar with the main surface of the interlayer insulating g film 1117.

Next, in a step of FIG. 39, a resist 1220 is formed and patterned on the interlayer insulating film 1117. This pattern is used to open an upper portion of the mark holes 1118. Subsequently, the interlayer insulating film 1117 is etched with the resist 1220 as a mask, to form the recess region RR. The end surface of the plug 1128 on the side opposite to the silicon substrate 101 thereby protrudes from the surface of the recess region RR by about 50 nm.

This etching is a wet etching using hydrogen fluoride (HF) or BHF, or a dry etching using CF-based gas such as $C_4F_8$.

Further, since it is desirable that the plug 1128 should not protrude from the storage node contact hole in the element formation region, a pattern with the resist 1220 is used on the storage node contact hole so as not to be etched as above.

Next, in a step of FIG. 40, the barrier metal 1119 is formed of a layered film consisting of Ti (titanium) having a thickness of, e.g., 50 nm and TiN (titanium nitride) having a thickness of 100 nm.

At this time, a projection PJ is caused correspondingly to the protrusion of the plug 1128 in a surface of the barrier metal 1119 corresponding to the position of the mark hole 1118.

After this, the conductive film 1123 is formed of Pt (platinum) having a thickness of, e.g., 50 nm on the barrier metal 1119, and the conductive film 1123 also becomes projected because of the projection PJ of the barrier metal 1119.

Further, in patterning of the barrier metal 1119, the projection in the surface of the barrier metal 1119 corresponding to the position of the mark hole 1118 as the position check mark MK16 is used to check alignment and overlay of the mask pattern of the stepper.

Further, in patterning of the conductive film 1123, the projection in the surface of the conductive film 1123 corresponding to the position of the mark hole 1118 as the position check mark MK16 is used to check alignment and overlay of the mask pattern of the stepper.

<F-4. Variation>

Though the above discussion of the sixth preferred embodiment is made on a case where the mark hole 1118 is filled with the doped polysilicon, the mark hole 1118 may be filled with a doped amorphous silicon or a non-doped amorphous silicon, or a metal film such as Ti (Titanium), TiN (titanium nitride), TaN (tantalum nitride), W (tungsten), Al (aluminum), AlCu (aluminum copper) or Cu (copper).

Further, the above discussion is made on a case where the conductive film 1123 is of Pt (platinum), the conductive film 1123 has only to be an opaque conductive film and may be Ru (ruthenium), $RuO_2$ (ruthenium oxide), W (tungsten), Al (aluminum), AlCu (aluminum copper) or Cu (copper).

Though the marks discussed in the first to sixth preferred embodiments have a form in which a plurality of elongated mark structures are arranged in parallel and a form in which a plurality of arrays each consisting of aligned holes are arranged in parallel, the plan view of the mark is not limited to these forms, but may have a form in which a plurality of rectangular ring-shaped mark structures are arranged or a form in which holes are arranged in a rectangular ring shape, or may have a form in which a plurality of cross-shaped mark structures are arranged or a form in which holes are arranged in a cross shape. Further, it goes without saying that other appearances generally used as an alignment mark or an overly check mark may be used.

Though discussions have been made in the first to third preferred embodiments on the case where a nitride film is used as an etching stopper of the interlayer insulating film which is an oxide film, the interlayer insulating film is not limited to an oxide film but may be a transparent insulating film and in this case, the etching stopper is not limited to a nitride film but has only to have an etching selection ratio to the interlayer insulating film. Further, in this case, an insulating film on the sidewall of the mark structure and the gate covered with the etching stopper has only to have an etching selection ratio to the etching stopper.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:

a semiconductor substrate;

a semiconductor element formed on said semiconductor substrate by overlaying a plurality of patterned layers; and a position check mark used for overlay of said plurality of layers, where said semiconductor element has a first wiring layer;

an interlayer insulating film covering said first wiring layer; and a second wiring layer formed on said interlayer insulating film, and where said position check mark has an opening provided by selectively removing said interlayer insulating film;

a mark structure formed in said opening, having said first wiring layer; and said second wiring layer placed along an outline of said mark structure.

2. The semiconductor device according to claim 1, wherein said second wiring layer is opaque or translucent, and projection and depression of said second wiring layer covering said mark structure are measured as a mark for position check when said second wiring layer is patterned.

3. The semiconductor device according to claim 1, wherein said semiconductor element includes a MOS transistor, said first wiring layer is a gate wiring layer, and said mark structure has the same structure as a gate of said MOS transistor.

4. A semiconductor device, comprising:

a semiconductor substrate;

a semiconductor element formed on said semiconductor substrate by overlaying a plurality of patterned layers; and a position check mark used for overlay of said plurality of layers, wherein said semiconductor element and said position check mark are separate from each other, where said semiconductor element has a first wiring layer;

a first interlayer insulating film covering said first wiring layer;

a second interlayer insulating film formed on said first interlayer insulating film; and a second wiring layer formed at least on said second interlayer insulating film, and where said position check mark has an opening provided by selectively removing said first interlayer insulating film;

a mark structure formed in said opening, having said first wiring layer;

said second interlayer insulating film provided extending from on said first interlayer insulating film to on said mark structure, having an outline with projection and depression corresponding to an outline of said mark structure; and said second wiring layer placed along said outline of said second interlayer insulating film.

5. The semiconductor device according to claim 4, wherein said second wiring layer is opaque or translucent, and projection and depression of said second wiring layer constituting said position check mark are measured as a mark for position check when said second wiring layer is patterned.

6. The semiconductor device according to claim 5, wherein said semiconductor element is a memory element including a MOS transistor and a capacitor electrically connected to said MOS transistor, said first wiring layer is a gate wiring layer, said mark structure has the same structure of a gate of said MOS transistor, and said second wiring layer is a cell plate of said capacitor.

7. A semiconductor device, comprising:

a semiconductor substrate;

a semiconductor element formed on said semiconductor substrate by overlaying a plurality of patterned layers; and a position check mark used for overlay of said plurality of layers, wherein said semiconductor element and said position check mark are separate from each other, where said semiconductor element has an interlayer insulating film formed on said semiconductor substrate;

a contact hole penetrating said interlayer insulating film to reach said semiconductor substrate; and a first conductive film placed to fill at least said contact hole, and where said position check mark has a plurality of mark holes so formed as to penetrate said interlayer insulating film; and a second conductive film so placed as to fill at least said plurality of mark holes.

8. The semiconductor device according to claim 7, wherein the opening size of each of said plurality of mark holes ranges from as large as that of said contact hole to twice as large as that of said contact hole.

9. The semiconductor device according to claim 7, wherein said plurality of mark holes are formed through the same process as said contact hole.

10. The semiconductor device according to claim 7, wherein said semiconductor element is a capacitor, said first conductive film is a storage node, said storage node is so provided as to protrude from said contact hole, said capacitor further has a capacitor sidewall which is conductive and extends perpendicularly to said interlayer insulating film, surrounding a protruding portion of said storage node, said second conductive film which is part of a conductive film including said first conductive film, and is so formed on said interlayer insulating film as to fill said plurality of mark holes and extend over said plurality of mark holes, and said position check mark further has a sidewall which is conductive, has almost the same structure as said capacitor sidewall and extends perpendicularly to said interlayer insulating film, surrounding an outer peripheral edge portion of said second conductive film.

* * * * *